(12) United States Patent
Yokogawa

(10) Patent No.: US 9,960,198 B2
(45) Date of Patent: May 1, 2018

(54) SOLID-STATE IMAGE SENSOR, AND IMAGING SYSTEM

(75) Inventor: Sozo Yokogawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 14/233,220

(22) PCT Filed: Jul. 11, 2012

(86) PCT No.: PCT/JP2012/067717
§ 371 (c)(1),
(2), (4) Date: Jan. 16, 2014

(87) PCT Pub. No.: WO2013/015117
PCT Pub. Date: Jan. 31, 2013

(65) Prior Publication Data
US 2014/0146207 A1    May 29, 2014

(30) Foreign Application Priority Data

Jul. 28, 2011   (JP) ................................ 2011-165786

(51) Int. Cl.
*H04N 5/335* (2011.01)
*H01L 27/146* (2006.01)
(Continued)

(52) U.S. Cl.
CPC ........ *H01L 27/14621* (2013.01); *G01J 3/027* (2013.01); *G01J 3/0259* (2013.01);
(Continued)

(58) Field of Classification Search
USPC ........................................................ 348/280
See application file for complete search history.

(56) References Cited

U.S. PATENT DOCUMENTS

| 5,844,289 A * | 12/1998 | Teranishi et al. ............. 257/432 |
| 7,223,960 B2 * | 5/2007 | Mouli ............... H01L 27/14621 |
|  |  | 250/208.1 |

(Continued)

FOREIGN PATENT DOCUMENTS

| JP | 2008-177191 A1 | 7/2008 |
| JP | 2008-177362 A | 7/2008 |

(Continued)

OTHER PUBLICATIONS

Japanese Office Examination Report issued in connection with related Japanese Patent Application No. 2011-165786 dated Feb. 10, 2015.

(Continued)

*Primary Examiner* — Anthony J Daniels
(74) *Attorney, Agent, or Firm* — Dentons US LLP

(57) ABSTRACT

The present technology relates to solid-state image sensor and an imaging system which are capable of providing a solid-state image sensor and an imaging system which are capable of realizing a spectroscopic/imaging device for visible/near-infrared light having a high sensitivity and high wavelength resolution, and of achieving two-dimensional spectrum mapping with high spatial resolution. There are provided a two-dimensional pixel array, and a plurality of types of filters that are arranged facing a pixel region of the two-dimensional pixel array, the filters each including a spectrum function and a periodic fine pattern shorter than a wavelength to be detected, wherein each of the filters forms a unit which is larger than the photoelectric conversion device of each pixel on the two-dimensional pixel array, where one type of filter is arranged for a plurality of adjacent photoelectric conversion device groups, wherein the plurality of types of filters are arranged for adjacent unit groups to form a filter bank, and wherein the filter banks are arranged in a unit of N×M, where N and M are integers of one or (Continued)

more, facing the pixel region of the two-dimensional pixel array.

19 Claims, 16 Drawing Sheets

(51) Int. Cl.
| | |
|---|---|
| H04N 5/374 | (2011.01) |
| H04N 5/378 | (2011.01) |
| G02B 5/20 | (2006.01) |
| H04N 9/07 | (2006.01) |
| H04N 5/33 | (2006.01) |
| G02B 5/00 | (2006.01) |
| G01J 3/12 | (2006.01) |
| G01J 3/18 | (2006.01) |
| G01J 3/28 | (2006.01) |
| G01J 3/02 | (2006.01) |

(52) U.S. Cl.
CPC . *G01J 3/12* (2013.01); *G01J 3/18* (2013.01); *G01J 3/2803* (2013.01); *G01J 3/2823* (2013.01); *G02B 5/008* (2013.01); *G02B 5/201* (2013.01); *H01L 27/14629* (2013.01); *H04N 5/332* (2013.01); *H04N 5/374* (2013.01); *H04N 5/378* (2013.01); *H04N 9/07* (2013.01); *G01J 2003/1213* (2013.01); *G01J 2003/282* (2013.01); *G01J 2003/2806* (2013.01); *G01J 2003/2816* (2013.01); *G01J 2003/2826* (2013.01)

(56) References Cited

U.S. PATENT DOCUMENTS

| | | | | |
|---|---|---|---|---|
| 8,054,371 | B2* | 11/2011 | Wang et al. | 348/342 |
| 2003/0173501 | A1* | 9/2003 | Thio et al. | 250/216 |
| 2006/0175551 | A1* | 8/2006 | Fan et al. | 250/353 |
| 2006/0273245 | A1* | 12/2006 | Kim et al. | 250/226 |
| 2008/0030803 | A1 | 2/2008 | Min et al. | |
| 2010/0244168 | A1* | 9/2010 | Shiozawa et al. | 257/432 |
| 2010/0320369 | A1 | 12/2010 | Koskinen et al. | |
| 2011/0019041 | A1* | 1/2011 | Ishiwata et al. | 348/280 |
| 2013/0153767 | A1* | 6/2013 | Savoy | G01J 1/0429 |
| | | | | 250/338.1 |

FOREIGN PATENT DOCUMENTS

| | | |
|---|---|---|
| JP | 2009-238942 A | 10/2009 |
| JP | 2010-165718 A | 7/2010 |
| JP | 2012-059865 A | 3/2012 |
| WO | WO/2008/082569 A1 | 7/2008 |
| WO | WO/2010/108086 A2 | 9/2010 |

OTHER PUBLICATIONS

Extended European Search Report issued in connection with EP counterpart application No. EP 12817111.3 dated Jun. 1, 2015.
Haidar, Riad, et al., "Free-standing subwavelength metallic gratings for snapshot multispectral imaging", Applied Physics Letters, vol. 96, 2010, pp. 221104-1-221104-3.
Ebbesen, T. W., et al., Extraordinary Optical transmission Through Sub-wavelength Hole Arrays; Nature, vol. 391, Issue 6668, 1998, pp. 667-669.
Catrysse, Peter, B. et al., "Integrated Color Pixels in 0.18-um Complementary Metal Oxide Semiconductor Technology", Journal Optical Society of America; vol. 20, No. 12, 2003; pp. 2293-2306.

* cited by examiner

SOLID-STATE IMAGE SENSOR, AND IMAGING SYSTEM

TECHNICAL FIELD

The present technology relates to a solid-state image sensor including a metal thin film filter having a periodic fine pattern shorter than a wavelength to be detected, and an imaging system.

BACKGROUND ART

A spectroscopic sensor is used for non-invasive examination in various fields such as medical treatment, cosmetic care, and health.

A general spectroscopic sensor irradiates a subject with electromagnetic light from a visible light source, an infrared light source or the like, or by a laser, an LED or the like that radiates light at narrow band wavelength, and causes the reflected light or a light component shifted by Raman scattering to pass through a slit to be transmitted through/reflected by a grating. The spectroscopic sensor thereby converts a signal intensity distribution in the wavelength direction into a spatial signal intensity distribution.

Then, an incident spectrum may be restored by detecting the electromagnetic wave intensity of each wavelength component which has been spatially separated by a one-dimensional linear sensor or a two-dimensional sensor.

Now, as a solid-state image sensor to be used as a detector, there may be cited a CCD (Charge Coupled Device)-type solid-state image sensor or a CMOS (Complementary Metal Oxide Semiconductor)-type solid-state image sensor.

These image sensors are basically equivalent to the image sensor used in a general portable information terminal such as a digital still camera, video camera recorder or a smartphone, and the number of pixels of a solid-state image sensor for general imaging use is great, being more than ten million.

With both the solid-state image sensor used for the spectroscopic sensor and the solid-state image sensor used for general imaging use, each pixel of the image sensor accumulates signal charge according to the light intensity from the subject, and samples electrical signals that are according to the amount of charge accumulated as analogue or digital data and forms an image.

Now, regardless of being a spectroscopic sensor or an imaging sensor, the solid-state image sensor has sensitivity in a specific electromagnetic wavelength band.

For example, many of the CCD- or CMOS-type solid-state image sensors used invisible light/near-infrared light bands are fabricated based on silicon. Silicon has sensitivity only with respect to a wavelength shorter than that of a near-infrared ray (1.1 µm or less) due to its band gap.

However, there is no energy resolution (wavelength resolution) with respect to an electromagnetic wave with wavelength shorter than 1.1 µm, and it is difficult to identify light of which wavelength is detected based on the accumulated charge. Accordingly, the spectroscopic sensor generally uses a grating to enable detection of information of light intensity for each color/wavelength.

As an inevitable issue in the case of dispersing light by a grating, there is an issue of the energy of the light being spatially separated in the wavelength direction.

That is, to realize a spectroscope with high wavelength resolution (high dispersion) to dilute, in the wavelength direction, and detect the total light from a subject, the sensitivity of the solid-state image sensor has to be increased to that extent, or the integral time has to be increased.

Furthermore, there is also an issue that, since the incident light has to be transmitted through a narrow slit, the amount of light entering the sensor is small in the first place.

On the other hand, with a general color imaging device, the following method is adopted in many cases to acquire a color image.

That is, a method is often adopted according to which several types of on-chip color filters for selectively allowing a specific wavelength component to pass to each of two-dimensionally arranged pixels are provided, light intensity information for a plurality of wavelengths is acquired from a small number of adjacent pixel groups, and a color image is restored by an interpolation process by demosaicing.

In the case of the method above of arranging several types of filters on a two-dimensional pixel plane, unlike with the grating or the slit structure described above, light is not removed by a slit, but there is a big issue in the case of dispersion with high wavelength resolution.

That is, since organic materials such as dye and pigment forming the filters are formed by being applied, it is literally not possible to apply several types of filters at once.

That is, compared to a normal imaging device for synthesizing a color image from three colors, R, G and B, the cost is greatly increased for a spectroscopic device which requires a very large number of filters of ten colors or twenty colors, and realization is not easy.

However, in recent years, a hole array structure where holes of about the same degree or finer than a detection wavelength are periodically arranged on a conductive thin film, or an island array structure which is in negative and positive relation with the above structure is known as a plasmon resonator structure.

Moreover, the plasmon resonator structure is reported to function as a filter capable of adjusting the transmission wavelength by a physical structure when the periodicity and hole/dot shapes are optimized (see Non-Patent Documents 1 and 2).

Furthermore, techniques for using the plasmon resonator as a color filter are also disclosed (see Patent Documents 1, 2 and 3).

These techniques are advantageous in that, since each of the filters may be realized by patterning according to a periodic pattern on a metal thin film, many types of filters may be applied at once.

CITATION LIST

Patent Documents

Patent Document 1: Japanese Patent Application Laid-Open No. 2008-177191

Patent Document 2: WO 2008/082569 A1

Patent Document 3: Japanese Patent Application Laid-Open No. 2010-165718

Non-Patent Documents

Non-Patent Document 1: Ebbesen, T. W. et al., Nature, Volume 391, Issue 6668, pp. 667-669, 1998

Non-Patent Document 2: P. B. Catrysse & B. A. Wandell, J. Opt. Soc. Am. A, Vol. 20, No. 12, p. 2293-2306, 2003

SUMMARY OF THE INVENTION

Problems to be Solved by the Invention

However, issues still remain with the solid-state image sensors according to the color filter techniques disclosed in the preceding patents.

The plasmon resonator structure is a structure that serves a spectrum function by a structure provided with repeated periodic structures of a specific pitch such as $\lambda/2$ or $\lambda/4$ of an electromagnetic wavelength. Accordingly, it is not suitably applied to pixels that are minute to about the same degree as the wavelength, and is, in reality, applied only to solid-state image sensors whose pixel sizes are greater by several times than the electromagnetic wavelengths.

Furthermore, many types of filters are necessary to obtain an intensity profile of a light signal with high wavelength resolution, and there is an issue that the spatial resolution is greatly reduced. Also, the documents mentioned above do not describe specific means for restoring an input spectrum from a pixel output value of the solid-state image sensor.

Also, the applicant proposes a method of realizing a spectrum function at a low cost by mounting a metal thin film filter on apart of a pixel area of a solid-state image sensor. However, with this method, since the pixel area where the filter may be mounted is restricted, there is an issue that the number of filters that can be arranged is reduced.

Therefore, this is disadvantageous in view of the wavelength resolution or the SN of a signal to be detected, compared to a case of mounting the filter on the entire solid-state image sensor.

Furthermore, the accuracy of fine processing is restricted, and to realize higher wavelength resolution, more specifically, ultra-high dispersion of about $\Delta\lambda=1$ nm, by this filter structure alone, there is an issue regarding the accuracy of the fine processing, and the possibility of realization is low at this point.

Furthermore, one type of plasmon resonator filter is not a narrow band filter, and shows complicated transmission properties for respective wavelengths. Accordingly, to estimate an input spectrum from the transmission light intensity of the filters, some signal restoration process is required.

However, the patent documents mentioned above do not disclose methods related to waveform signal processes.

The present technology is to provide a solid-state image sensor and an imaging system which are capable of realizing a spectroscopic/imaging device for visible/near-infrared light having a high sensitivity and high wavelength resolution, and of achieving two-dimensional spectrum mapping with high spatial resolution.

Solutions to Problems

A solid-state image sensor according to a first aspect of the present invention includes: a two-dimensional pixel array where pixels each including a photoelectric conversion device are arranged in an array; and a plurality of types of filters that are arranged facing a pixel region of the two-dimensional pixel array, the filters each including a spectrum function and a periodic fine pattern shorter than a wavelength to be detected, wherein each of the filters forms a unit which is larger than the photoelectric conversion device of each pixel on the two-dimensional pixel array, where one type of filter is arranged for a plurality of adjacent photoelectric conversion device groups, the plurality of types of filters are arranged for adjacent unit groups to form a filter bank, and the filter banks are arranged in a unit of N×M, where N and M are integers of one or more, facing the pixel region of the two-dimensional pixel array.

An imaging system according to a second aspect of the present invention includes: a solid-state image sensor; and an optical system for imaging a subject image on a two-dimensional pixel array of the solid-state image sensor, wherein the solid-state image sensor includes the two-dimensional pixel array where pixels each including a photoelectric conversion device are arranged in an array, and a plurality of types of filters that are arranged facing a pixel region of the two-dimensional pixel array, the filters each including a spectrum function and a periodic fine pattern shorter than a wavelength to be detected, each of the filters forms a unit which is larger than the photoelectric conversion device of each pixel on the two-dimensional pixel array, where one type of filter is arranged for a plurality of adjacent photoelectric conversion device groups, the plurality of types of filters are arranged for adjacent unit groups to form a filter bank, and the filter banks are arranged in a unit of N×M, where N and M are integers of one or more, facing the pixel region of the two-dimensional pixel array.

Effects of the Invention

According to the present invention, a spectroscopic/imaging device for visible/near-infrared light having a high sensitivity and high wavelength resolution may be realized, and two-dimensional spectrum mapping with high spatial resolution may be achieved.

MODE FOR CARRYING OUT THE INVENTION

Hereinafter, an embodiment of the present invention will be described in association with the drawings.

Moreover, description will be given in the following order.
1. Example Schematic Configuration of Entire CMOS Solid-State Image Sensor
2. Positional Relationship of Solid-State Image Sensor and Metal Thin Film Filter
3. Example Configuration of Metal Film Filter
4. Example Structure of Solid-State Image Sensor where Metal Thin Film Filter is Arranged
5. Method of Estimating Electromagnetic Spectrum Waveform of Subject
6. Example Configuration of Spectroscopic Imaging System
7. Manufacturing Method of Metal Thin Film Filter
<1. Example Schematic Configuration of Entire CMOS Solid-State Image Sensor>

Figure 1:
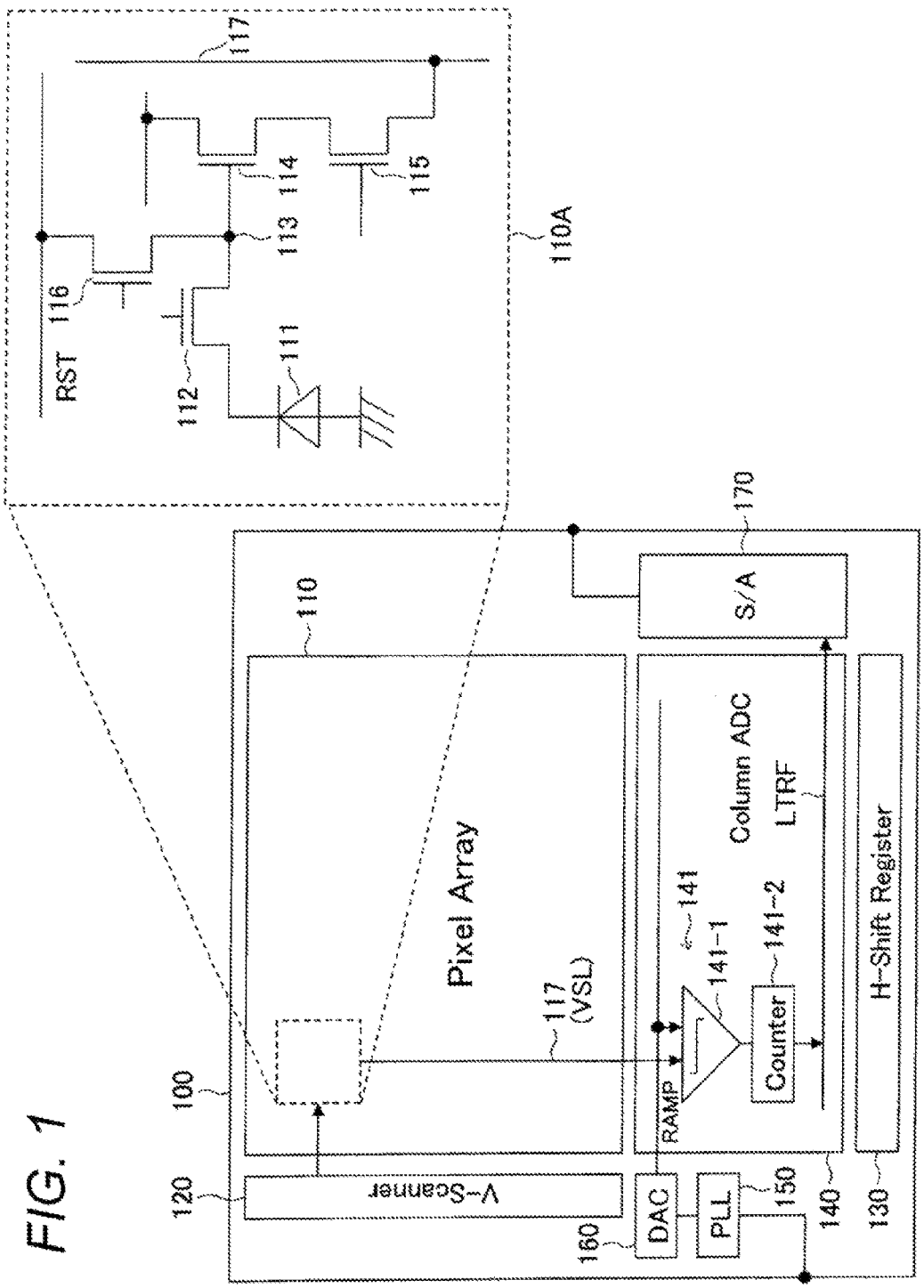
FIG. 1 is a block diagram showing an example configuration of a CMOS solid-state image sensor according to a present embodiment.

FIG. 1 is a block diagram showing an example configuration of a CMOS solid-state image sensor according to the present embodiment.

In the following, an example is described where a metal filter of the present technology is mounted on a backside illumination CMOS solid-state image sensor. Additionally, it is needless to say that application to an existing front-side illumination CMOS solid-state image sensor, a CCD solid-state image sensor, an image sensor using a quantum dot structure of other than Si, such as CdSe, as a photodetector unit, or a photoconductive image sensor using an organic photoelectric material is also possible.

As shown in FIG. 1, a solid-state image sensor 100 includes a pixel array 110 as a two-dimensional pixel array, a vertical scanning circuit 120, a horizontal transfer scanning circuit 130, and a column ADC circuit 140 which is an ADC (analog digital converter) group.

The solid-state image sensor 100 includes a PLL circuit 150, a DAC (digital analog converter) 160 for generating a reference signal RAMP, and a sense amplifier circuit (S/A) 170.

In the pixel array 110, a plurality of pixels 110A each including a photo diode (photoelectric conversion device) and an in-pixel amplifier are arrayed two-dimensionally (in matrix) in m rows and n columns.

Each pixel 110A is configured from a photo diode for performing photoelectric conversion, and a pixel reading circuit configured from a plurality of transistors for reading accumulated signals.

FIG. 1 shows an example of a pixel of a CMOS image sensor configured from four transistors according to the present embodiment.

In the pixel 110A, the charge accumulated in a photo diode 111 is transferred to an FD (Floating Diffusion) 113 via a transfer transistor 112. The FD 113 is connected to the gate of an amplification transistor 114.

A pixel whose signal is to be read may be selected by turning on a selection transistor 115. The signal of a selected pixel is read onto a signal line 117 as a signal corresponding to the amount of accumulated charge by driving the amplification transistor 114 in a source follower manner. Also, the pixel signal may be reset by turning on a reset transistor 116.

The signal level of the signal read from each pixel is extracted by CDS operation, and is output to outside the device via the column ADC circuit 140 and the sense amplifier circuit 170.

The column ADC circuit 140 has a plurality of column processing units (ADC) 141, which are ADC blocks, arranged therein.

That is, the column ADC circuit 140 includes a k-bit digital signal conversion function, where each column processing unit 141 is arranged for each vertical signal line (column line) 117, configuring column parallel ADC blocks.

Each column processing unit 141 includes a comparator 141-1 for comparing a reference signal RAMP which is a ramp waveform obtained by changing a reference signal generated by the DAC 160 in a stepwise manner and an analog signal VSL obtained for each row line from a pixel via the vertical signal line.

Furthermore, each column processing unit 141 includes a counter latch (counter) 141-2 for counting the comparison time and holding a count result.

The output of each counter 141-2 is connected to a horizontal transfer line LTRF having a k-bit width, for example.

Moreover, the sense amplifier circuit 170 in accordance with the horizontal transfer line LTRF is arranged.

At the column ADC circuit 140, analog signal potential VSL read onto the vertical signal line 117 is compared with the reference signal RAMP by the comparator 141-1 arranged for each column.

At this time, the counter 141-2 that is arranged for each column as with the comparator 141-1 is in operation.

Each column processing unit 141 converts the potential (analog signal) VSL of the vertical signal line 117 into a digital signal by the reference signal RAMP having a RAMP waveform and a counter value changing in one-to-one correspondence.

The column processing unit (ADC) 141 converts a change in the voltage of the reference signal RAMP (potential Vslop) into a change in time, and the time is converted into a digital value by being counted at a predetermined cycle (clock).

When the analog signal VSL and the reference signal RAMP (Vslop) intersect, the output of the comparator 141-1 is inverted, the input clock of the counter 141-2 is stopped, or the clock whose input was stopped is input to the counter 141-2, and AD conversion is completed.

After the AD conversion period described above is ended, the data held by the counter 141-2 is transferred to the horizontal transfer line LTRF by the horizontal transfer scanning circuit 130 and is output to an external signal processing circuit via the sense amplifier circuit 170, and a two-dimensional image is generated by predetermined signal processing.

Pixel value data that is output outside only includes intensity information corresponding to a single filter at each pixel position, and thus, the intensity information of each color component at each pixel position is restored based on the intensity information of an adjacent pixel of another color by interpolation by a demosaicing process, a convolution process or the like.

In addition, processes are performed with respect to white balance or gamma correction, contour enhancement, image compression and the like, and an image which is desirable to an observer or which is true to a subject is restored.

Additionally, in the case of a system-on-chip image sensor according to which an image processor is mounted on a chip, these types of signal processing may be performed on the same chip, and compressed images according to jpeg and mpeg methods may also be output in addition to raw image data.

<2. Positional Relationship of Solid-State Image Sensor and Metal Thin Film Filter>

Figure 2:
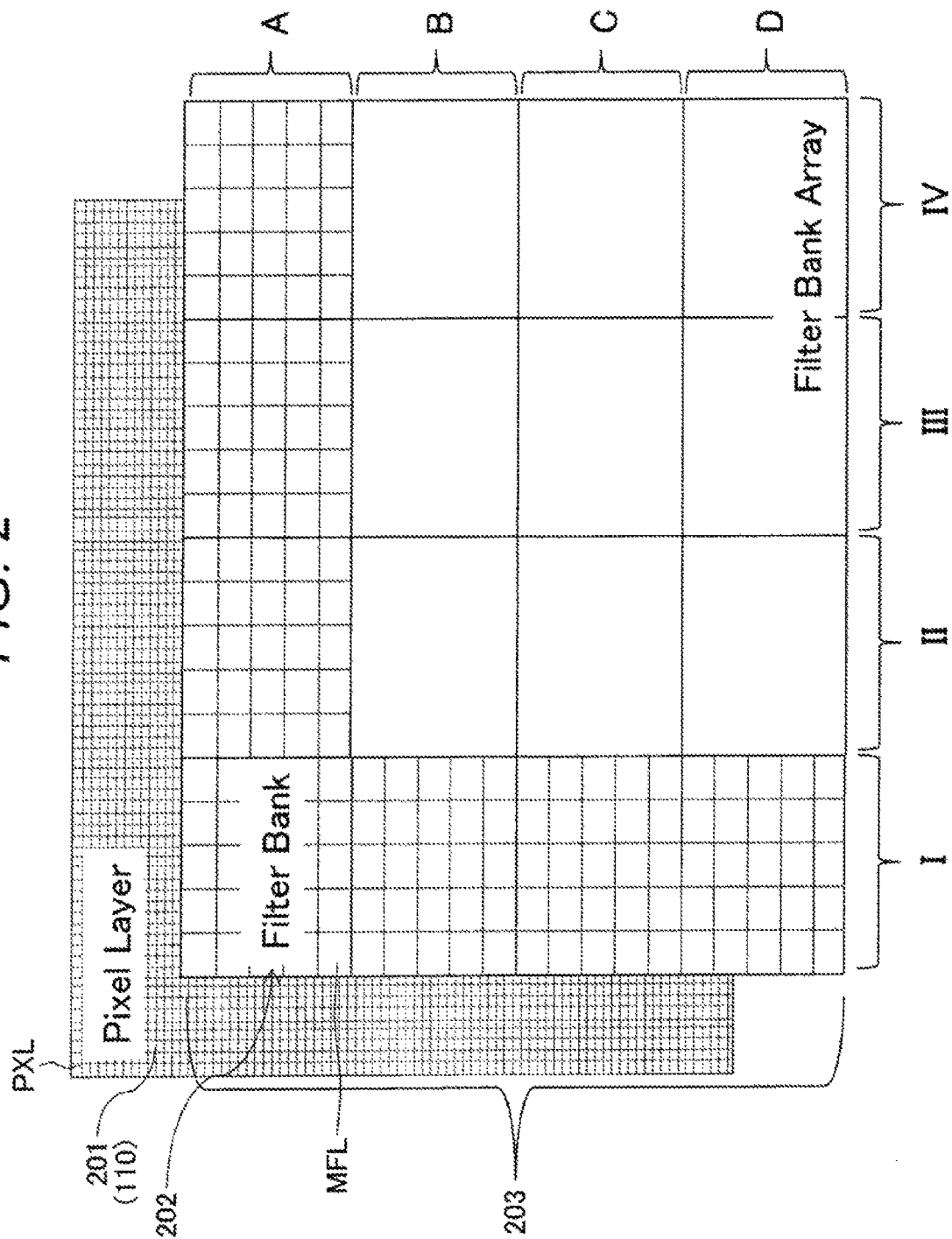
FIG. 2 is a diagram for describing a positional relationship of the solid-state image sensor according to the present embodiment and a present metal thin film filter.

FIG. 2 is a diagram for describing a positional relationship of the solid-state image sensor according to the present embodiment and a present metal thin film filter.

In FIG. 2, the pixel array 110 in FIG. 1 is shown as a two-dimensional pixel group 201.

The two-dimensional pixel group 201 is formed from 1000 pixels PXL vertically and horizontally, for example, and forms a very large two-dimensional pixel group including about one million pixels for a device with a small number of pixels, and several tens of millions of pixels when great.

A metal thin film filter bank (filter bank) 202 of the present embodiment is arranged facing the light incident surface of the two-dimensional pixel group (pixel array) 201.

Here, each filter MFL corresponds to one rectangle of the filter bank 202. With respect to the size of each filter 202FL, one type is applied for a pixel region of U pixels in the horizontal (X-axis) direction and V pixels in the vertical (Y-axis) direction for a light detection pixel PXL.

That is, one type of filter MFL is mounted for U*V adjacent pixels.

Furthermore, filters MFL, K types in the horizontal (X-axis) direction and L types in the vertical (Y-axis) direction, form one unit (filter bank) 202.

In the example in FIG. 2, one filter bank is formed from twenty types, i.e. K=5 and L=4.

Furthermore, the filter banks 202 are arranged over the entire surface of the two-dimensional image sensor, N units in the horizontal (X-axis) direction and M units in the vertical (Y-axis) direction, and is formed from N*M types of filter bank arrays 203.

That is, the filter bank 202 in the example in FIG. 2 includes twenty types, i.e. K=5 and L=4, of filters, and there are total 16 units, i.e. N=4 and M=4, of the same.

Also, the metal thin film filter of a spectrum function block of the filter bank group or the filter bank 202 is interposed between inter insulation films, and the insulation films may be of a plurality of refractive indices.

For example, of the filter bank array 203, the refractive index for line A in FIG. 2 may be set to be 1.42, the refractive index for line B 1.40, the refractive index for line C 1.38, the refractive index for line D 1.36, and so forth.

That is, a different refractive index may be set for each pixel region of the two-dimensional image sensor region.

Here, with respect to control of the refractive index of $SiO_2$, the refractive index may be adjusted at the time of forming an $SiO_2$ film by a plasma CVD method, for example, by controlling the flow rate of $CF_4$ gas.

<3. Example Configuration of Metal Film Filter>

FIGS. 3(A) to 3(D) are diagrams showing example structures of the metal thin film filter according to the present embodiment.

In FIGS. 3(A) to 3(D), the metal film filter is indicated by a reference sign 300.

Figure 3:
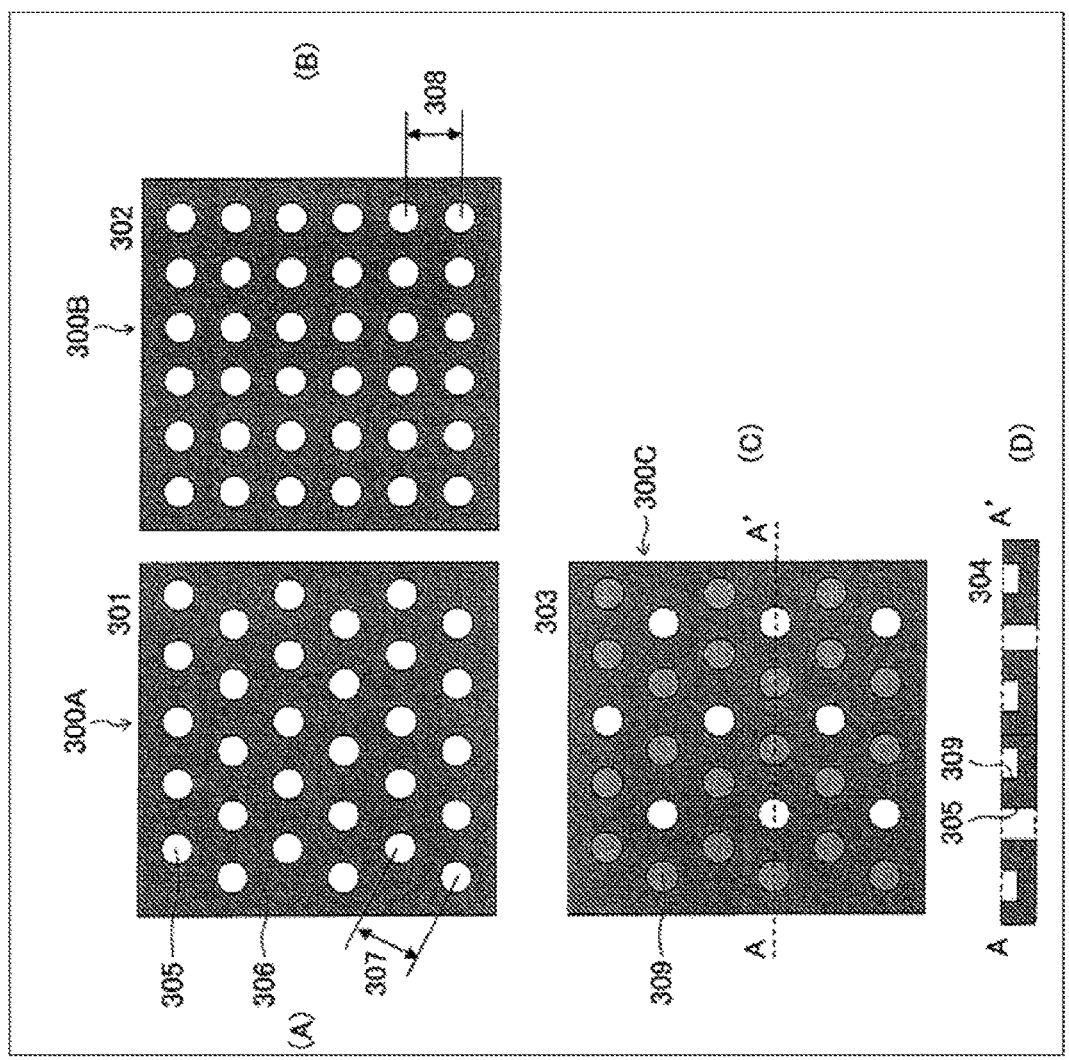
FIGS. 3(A) to 3(D) are diagrams showing example structures of the metal thin film filter according to the present embodiment.

FIG. 3(A) shows a honeycomb array 301, FIG. 3(B) shows an orthogonal matrix array 302, FIG. 3(C) shows an array 303 where through openings and non-through openings are present in a mixed manner, and FIG. 3(D) shows an array 304, which is a cross section along line A-A' in FIG. 3(A), including non-through holes having a concave structure.

The metal thin film filter 300 generates a surface plasmon polariton where a free electron and light are coupled at a specific electromagnetic wavelength by the fine structure pattern.

This metal thin film filter 300 is a sub-wavelength structure obtained by applying fine processing on a thin film of a conductive material (specifically, silver, aluminum, gold and the like are desirable) having a plasma frequency in the ultraviolet wavelength band.

Also, the metal thin film filter 300 has a resonance wavelength that is determined by the physical properties of the conductor and the physical properties of the pattern cycle, the opening size, the dot size, the film thickness and the medium around the structure.

The basic structure is a hole array structure, and openings (holes) (Hl) having a diameter smaller than the detection wavelength are arranged two-dimensionally.

Hole arrangement is preferably the honeycomb array 301 as shown in FIG. 3(A) or the orthogonal matrix array 302 as shown in FIG. 3(B), but other arrays are also possible as long as it is a structure having periodicity.

Here, the hole pitch, the hole size, and the film thickness are key parameters of the transmission properties. In FIGS. 3(A) to 3(D), hole openings are indicated by 305, and a conductor part is indicated by 306.

The opening size of the hole opening 305 is smaller than a wavelength desired to be passed, and is preferably about 100 (nm) in diameter. Due to the freedom in design, a range of about 50 (nm) to 200 (nm) is allowed.

Also, the thickness of the conductive thin film 306 is preferably about 100 (nm), but a range of about 10 (nm) to 200 (nm) is allowed.

Furthermore, the transmission wavelength may be changed by adjusting pitches 307 and 308 between adjacent holes, but a range of half to one wavelength of the effective electromagnetic wavelength in the medium is desirable, and specifically, a hole pitch of about 150 (nm) to 1000 (nm) is desirable.

Also, not all the openings of the hole array structure have to penetrate the conductive thin film, and as shown as the arrays 303 and 304 in FIGS. 3(C) and 3(B), some or all of the openings may also be non-through holes which are concave structures on the conductor.

FIGS. 3(C) and 3(D) are examples of a case where the through openings 305 and non-through openings 309 are periodically arranged.

Also, the hole opening preferably has a round shape from the standpoint of processing, but it may also be oval-shaped, polygonal-shaped, star-shaped, cross-shaped, ring-shaped, or gammadion-shaped, for example.

Figure 4:
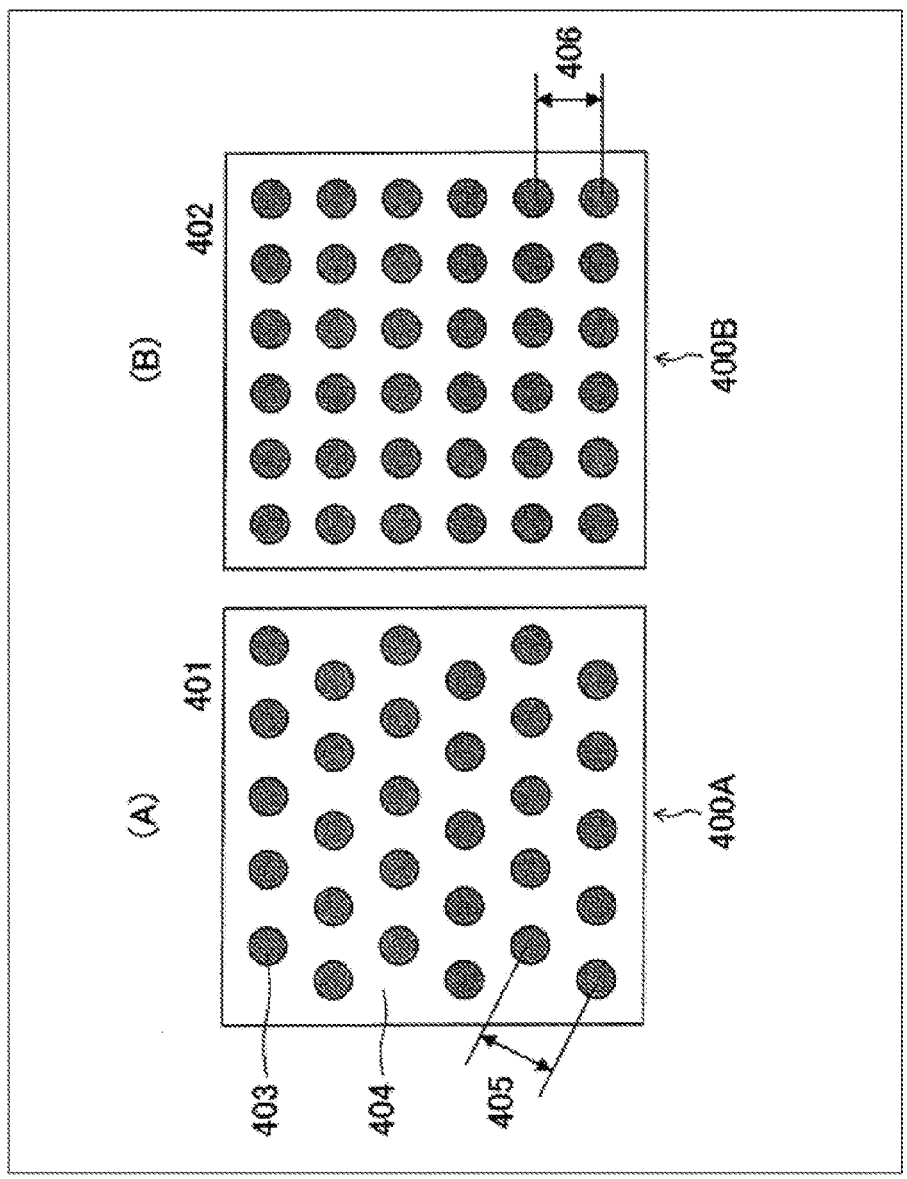
FIGS. 4(A) and 4(B) are diagrams showing plasmon resonator structures of an island structure negative-positive inverted from a hole array structure.

FIGS. 4(A) and 4(B) are diagrams showing plasmon resonator structures of an island structure negative-positive inverted from the hole array structure.

Island arrangement 400 is preferably a honeycomb array 401 as shown in FIG. 4(A) or an orthogonal matrix array 402 as shown in FIG. 4(B).

Each island 403 has a size of 20 to 200 (nm), and an inter-island part 404 is filled with a dielectric material such as a silicon dioxide film.

With respect to basic pitches 405 and 406 between adjacent islands, the wavelength is preferably half the effective electromagnetic wavelength in the medium, and when taking freedom in design into account, a range of one-quarter to one wavelength is desirable. Also, the island structure preferably has a round shape from the standpoint of processing, but it may also be oval-shaped, polygonal-shaped, star-shaped, cross-shaped, ring-shaped, or gamma-dion-shaped, for example.

<4. Example Structure of Solid-State Image Sensor where Metal Thin Film Filter is Arranged>

Figure 5:
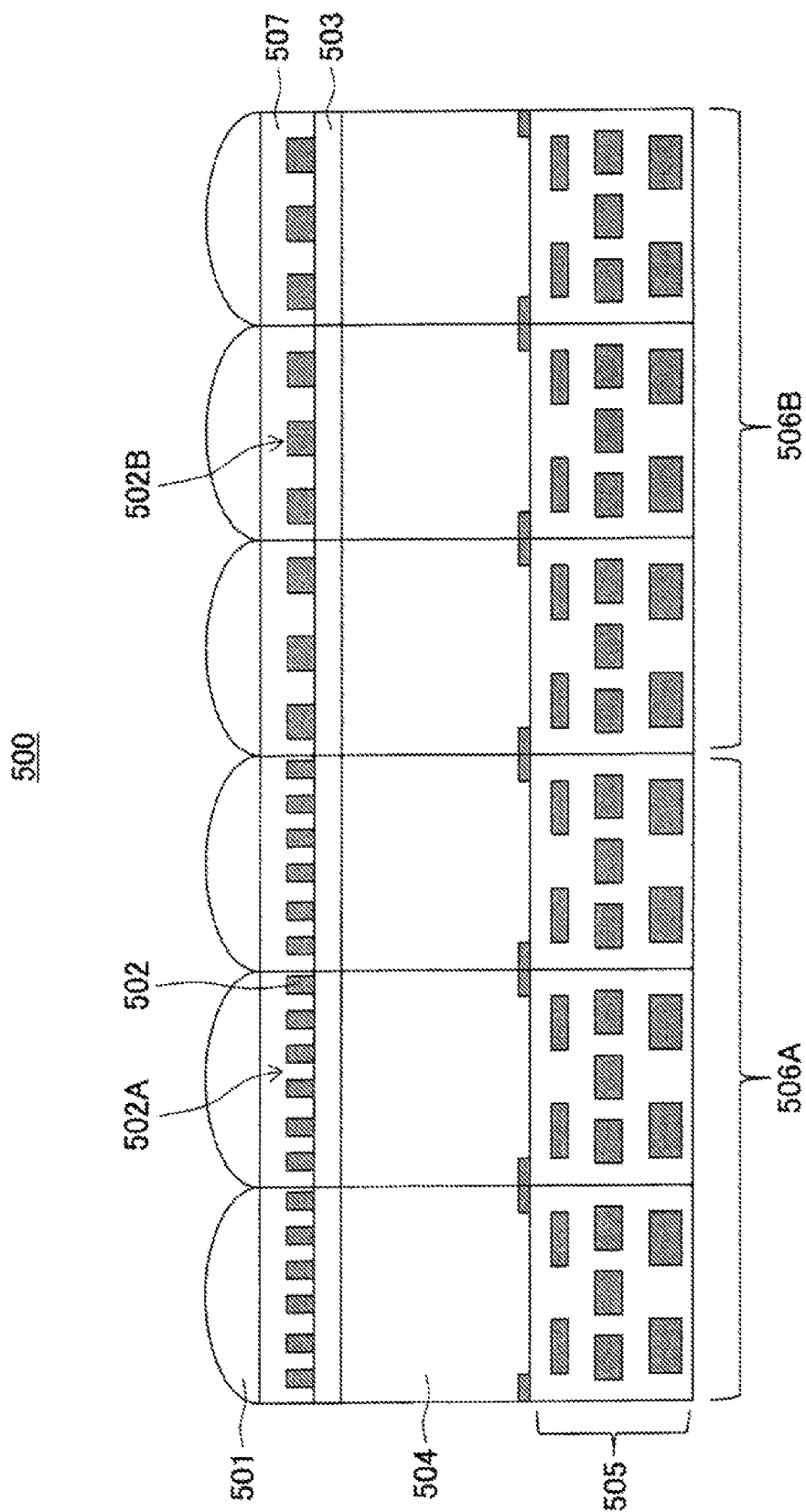
FIG. 5 is a diagram showing a first example structure of a backside illumination (BSI) CMOS solid-state image sensor where the present metal thin film filter is arranged.

FIG. 5 is a diagram showing a first example structure of a backside illumination (BSI) CMOS solid-state image sensor where the present metal thin film filter is arranged.

FIG. 5 shows a schematic cross-sectional diagram of six adjacent pixels among a pixel group forming a two-dimensional solid-state image sensor array. It is needless to say that, in reality, these pixels are present for all the pixels on the two-dimensional plane.

In a solid-state image sensor 500 in FIG. 5, the reference sign 501 indicates an on-chip microlens, the reference signs 502A and 502B indicate metal thin film filters, the reference sign 503 indicates a smoothing layer, the reference sign 504 indicates a photo diode, the reference sign 505 indicates a signal wiring layer, and the reference signs 506A and 506B indicate adjacent pixels.

The on-chip microlens 501 is an optical element for efficiently guiding light to the photo diode 504.

The photo diode 504 is an N-type region surrounded by a P-type region, or a P-type region surrounded by an N-type region, and serves the function of accumulating, as signal charges, electrons/holes generated by photoelectric conversion in a region where the potential is deeper than the surrounding region.

The metal thin film filters 502A and 502B are structures obtained by patterning a periodic structure on a metal thin film filter formed of Al or Ag, for example, at a sub-wavelength pitch (FIGS. 3(A) to 3(D), FIGS. 4(A) and 4(B)).

The metal thin film filters 502A and 502B are preferably mounted on the smoothing layer 503 formed from a silicon dioxide film, a nitride film or the like above the photo diode 504.

Also, an inter insulation film/protective film (smoothing layer) 507 for protecting the metal thin film filters 502A and 502B is preferably of composite material mainly composed of a silicon dioxide film ($SiO_2$) and $SiO_2$. Alternatively, magnesium fluoride ($MgF_2$), a hollow structure (air gap) or the like may also be used as a low refractive index medium.

Now, the conductive thin film filters 502A and 502B are preferably pattern structures shared between adjacent pixels. For example, in FIG. 5, the metal thin film filter 502A is mounted on three adjacent pixels 506A, and the metal thin film filter 502B is mounted on other three pixels 506B.

It is needless to say that the types of filters are not limited to two, and also, the number of pixels sharing the same filter is not limited to three and sharing by any integer number of pixels (for example, sharing by eight adjacent pixels, by 64 pixels, or by 128 pixels) is possible.

The signal wiring layer 505 is formed as a signal wiring layer for reading the signal charge accumulated in the photo diode 504 by photoelectric conversion to the outside.

The photo diode 504 is element-isolated by oxide isolation such as STI to be electrically isolated from an adjacent photo diode, and is also electrically isolated by, for example, a CION structure or an EDI structure by impurity implantation.

Figure 6:
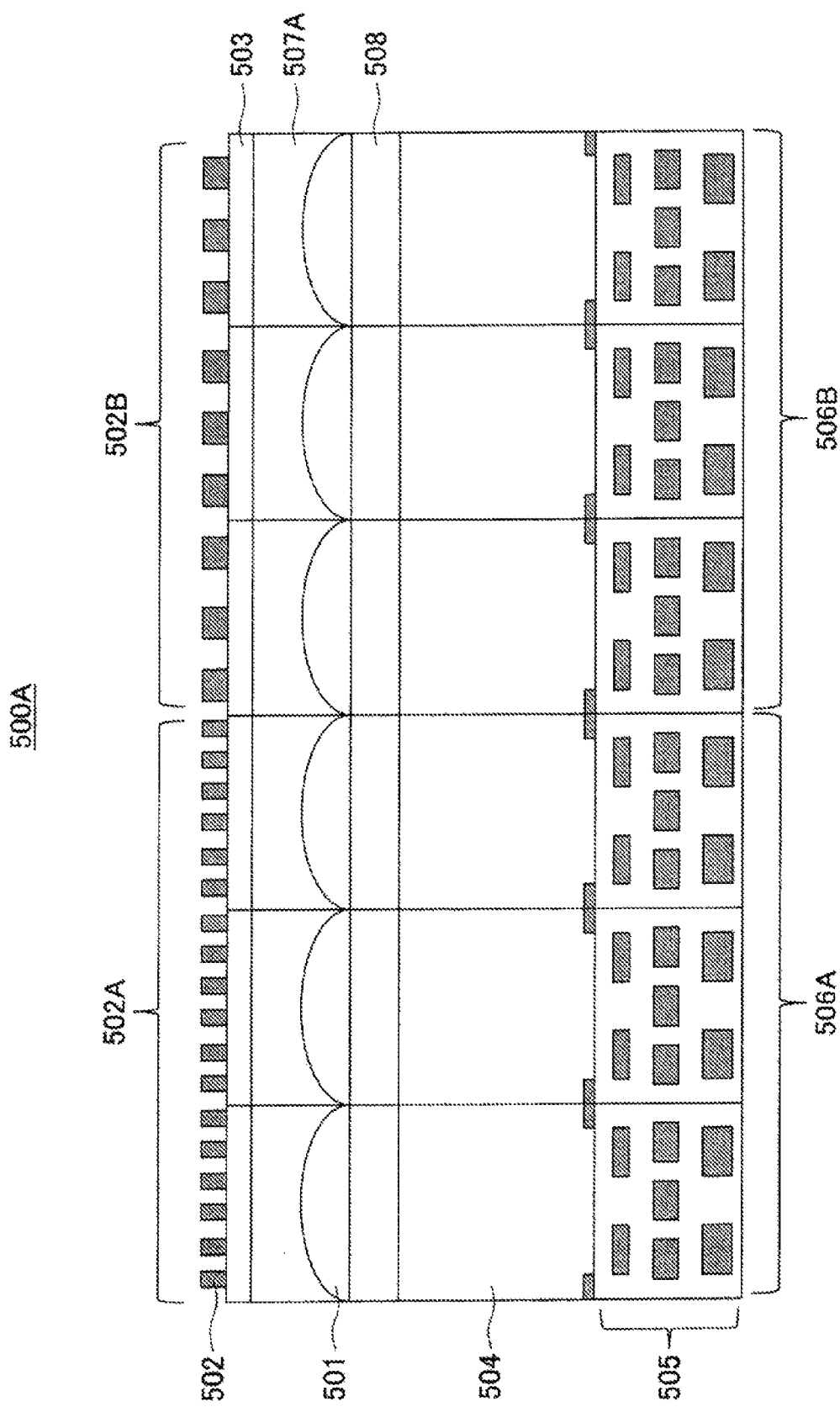
FIG. 6 is a diagram showing a second example structure of the backside illumination (BSI) CMOS solid-state image sensor where the present metal thin film filter is arranged.

FIG. 6 is a diagram showing a second example structure of the backside illumination (BSI) CMOS solid-state image sensor where the present metal thin film filter is arranged.

In order to facilitate understanding, the structural parts in FIG. 6 the same as those in FIG. 5 are denoted with the same reference signs.

A CMOS solid-state image sensor 500A in FIG. 6 is different from the CMOS solid-state image sensor 500 in FIG. 5 in the following manner.

The CMOS solid-state image sensor 500A has, above an on-chip microlens 501, a low refractive index smoothing layer 507A formed from a low refractive index material formed of $SiO_2$, magnesium fluoride ($MgF_2$), or the like. Here, the refractive index of the on-chip microlens 501 has to be higher than the refractive index of the smoothing layer 507A.

As described above, metal thin film filters 502A and 502B are preferably mounted on a smoothing layer 503 formed from a silicon dioxide film, a nitride film or the like above a photo diode 504.

In the example in FIG. 6, the smoothing layer 503 is formed on the low refractive index smoothing layer 507A, and the metal thin film filters 502A and 502B are formed on the smoothing layer 503.

As described above, the filters 502A and 502B are formed by a conductive thin film filter (plasmon resonator) 502, and are structures obtained by patterning a periodic structure on a metal thin film filter (FIGS. 3(A) to 3(D), FIGS. 4(A) and 4(B)) formed of Al or Ag, for example, at a sub-wavelength pitch.

Moreover, with a general solid-state image sensor, color filters of R, G and B are often mounted at the downstream (below) the on-chip microlens 501, and also in the example in FIG. 6, a general color filter 508 of organic pigment or dye may be arranged.

Thus, the degree of freedom regarding combinations of the existing filter 508 and the metal thin film filters 602A and 602B is increased, and a wavelength spectrum may be obtained with higher wavelength resolution.

Figure 7:
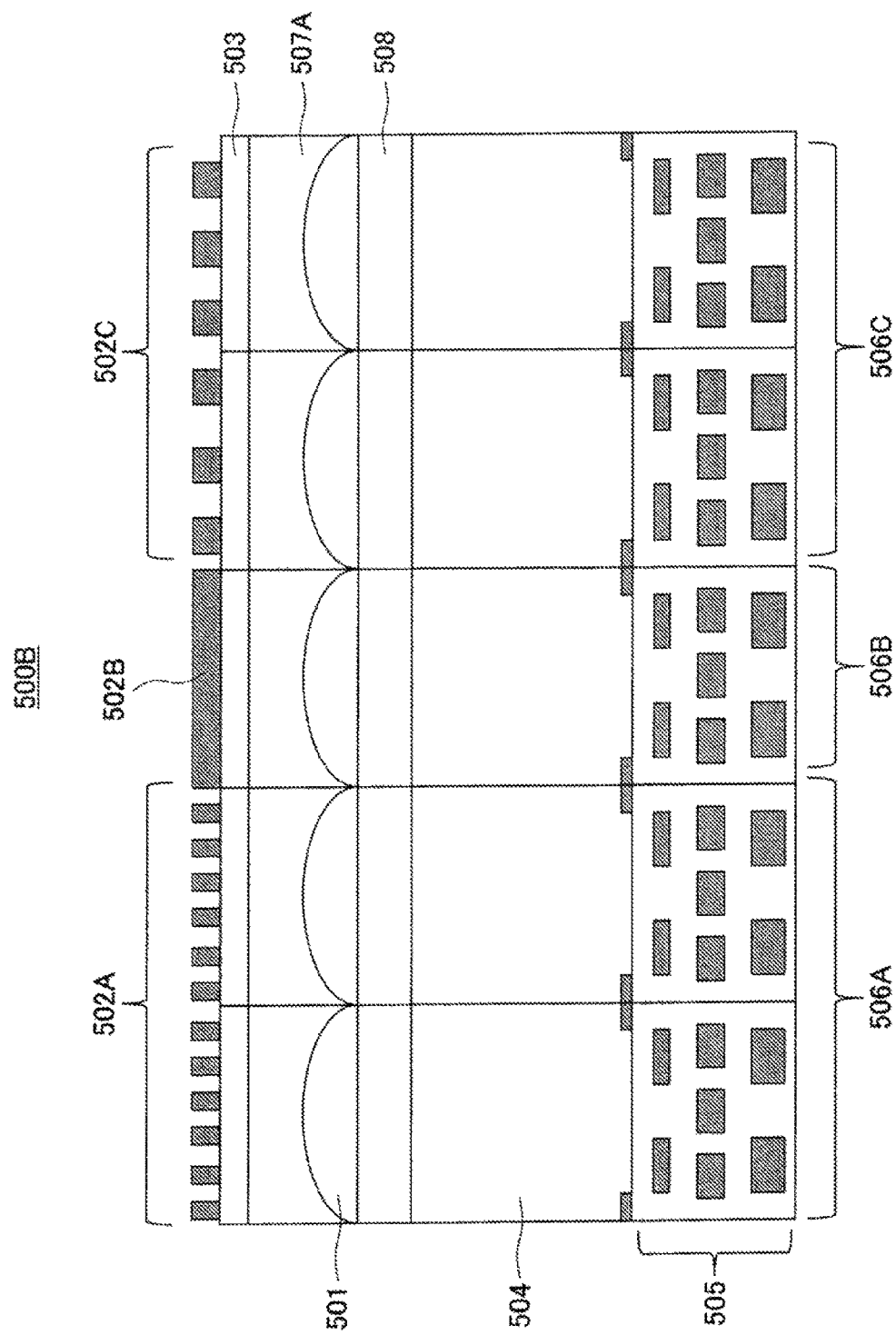
FIG. 7 is a diagram showing a third example structure of the backside illumination (BSI) CMOS solid-state image sensor where the present metal thin film filter is arranged.

FIG. 7 is a diagram showing a third example structure of the backside illumination (BSI) CMOS solid-state image sensor where the present metal thin film filter is arranged.

In order to facilitate understanding, the structural parts in FIG. 7 the same as those in FIGS. 5 and 6 are denoted with the same reference signs.

A CMOS solid-state image sensor 500B in FIG. 7 is different from the CMOS solid-state image sensor 500A in FIG. 6 in the following manner.

The CMOS solid-state image sensor 500B is an example where a metal thin film filter 502A is mounted on two pixels 506A, and a metal thin film filter 502C is mounted on other two pixels 506C.

A metal thin film filter 502B for shielding the entire surface of the pixel from light is mounted on a pixel 506B between the two pixels 506A and the two pixels 506C.

According to this configuration, the mixed color component which is light which has passed through the metal thin film filter 502A mixed with the pixel 506C including another metal thin film filter 502C may be greatly reduced, and the issue of deterioration in the image quality or deterioration in the wavelength spectrum due to color mixing may be alleviated.

As described above, the filters 502A, 502B and 502C are formed by a conductive thin film filter (plasmon resonator) 502, and are structures obtained by patterning a periodic structure on a metal thin film filter (FIGS. 3(A) to 3(D), FIGS. 4(A) and 4(B)) formed of Al or Ag, for example, at a sub-wavelength pitch.

Moreover, also in the example in FIG. 7, a general color filter 508 of organic pigment or dye may be arranged.

Figure 8:
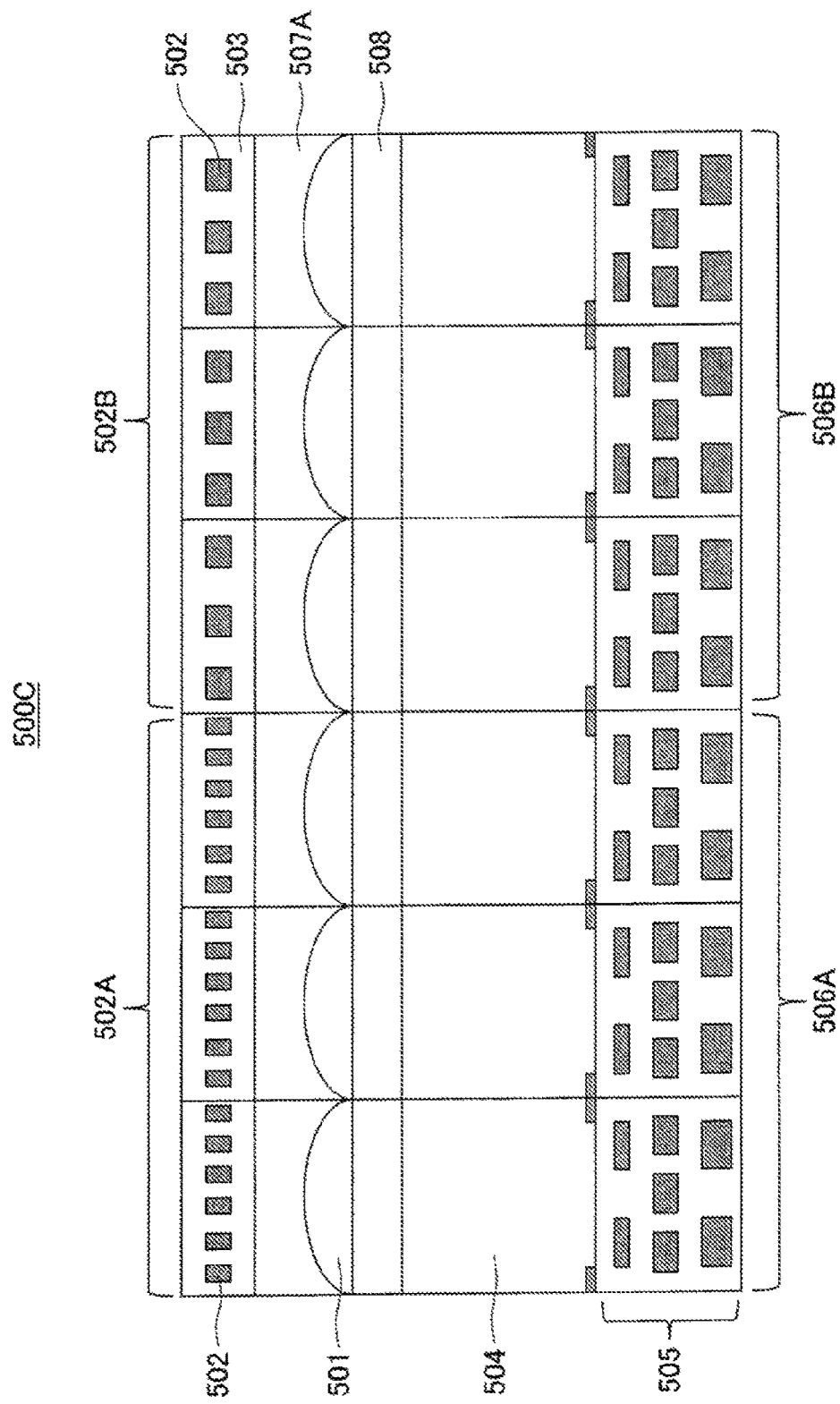
FIG. 8 is a diagram showing a fourth example structure of the backside illumination (BSI) CMOS solid-state image sensor where the present metal thin film filter is arranged.

FIG. 8 is a diagram showing a fourth example structure of the backside illumination (BSI) CMOS solid-state image sensor where the present metal thin film filter is arranged.

In order to facilitate understanding, the structural parts in FIG. 8 the same as those in FIGS. 5 to 7 are denoted with the same reference signs.

A CMOS solid-state image sensor 500C in FIG. 8 is different from the CMOS solid-state image sensor 500A in FIG. 6 in the following manner.

The CMOS solid-state image sensor 500C has a structure where the surroundings of metal thin film filters 502A and 502B are filled with a smoothing layer 503 as a protective film formed of a dielectric material such as SiO or SiN.

The solid-state image sensor 500C in FIG. 8 is an example where the metal thin film filter 502A is mounted on three pixels 506A, and a metal thin film filter 502B is mounted on other three pixels 506B.

It is needless to say that the types of metal thin film filters are not limited to two, and also, the number of pixels sharing the same filter may be any integer number of pixels.

As described above, the filters 502A and 502B are formed by a conductive thin film filter (plasmon resonator) 502, and are structures obtained by patterning a periodic structure on a metal thin film filter (FIGS. 3(A) to 3(D), FIGS. 4(A) and 4(B)) formed of Al or Ag, for example, at a sub-wavelength pitch.

Moreover, also in the example in FIG. 8, a general color filter 508 of organic pigment or dye may be arranged.

Figure 9:
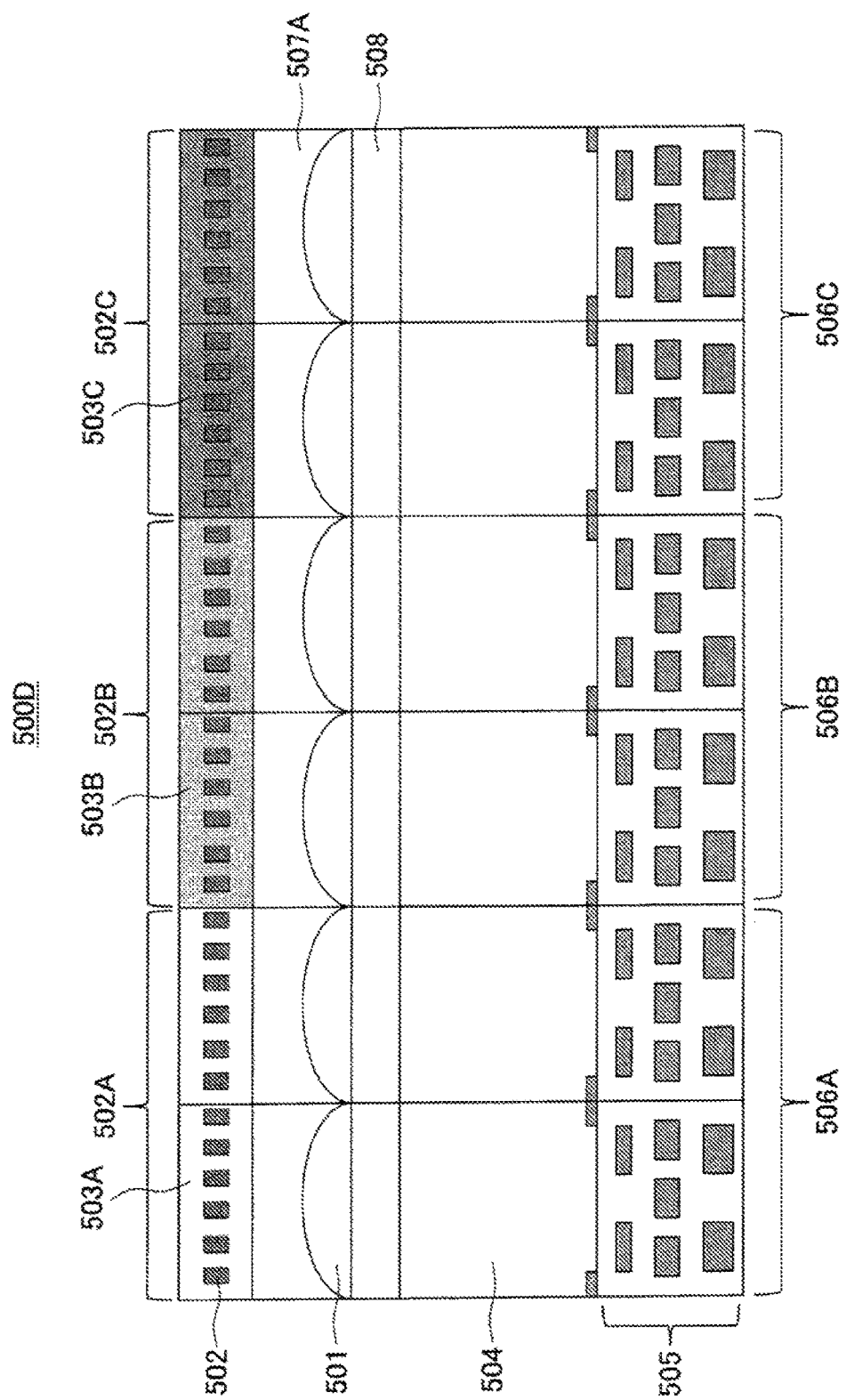
FIG. 9 is a diagram showing a fifth example structure of the backside illumination (BSI) CMOS solid-state image sensor where the present metal thin film filter is arranged.

FIG. 9 is a diagram showing a fifth example structure of the backside illumination (BSI) CMOS solid-state image sensor where the present metal thin film filter is arranged.

In order to facilitate understanding, the structural parts in FIG. 9 the same as those in FIGS. 5 to 8 are denoted with the same reference signs.

A CMOS solid-state image sensor 500D in FIG. 9 is different from the CMOS solid-state image sensor 500C in FIG. 8 in the following manner.

A conductive thin film filter is preferably a structure shared between adjacent pixels, and according to this CMOS solid-state image sensor 500D, the same metal thin film filter is mounted on six pixels, i.e. two pixels 506A, two pixels 506B, and two pixels 506C.

However, smoothing layers 503A, 503B and 503C formed of filled dielectric materials are each for a different pixel group, and in the example in FIG. 9, the adjacent two pixels 506A, 606B and 506C have different refractive indices.

An inter insulation film (protective film) for protecting the metal thin film filter is formed of a silicon dioxide film, for example, and the silicon dioxide film is formed by a plasma CVD method, and the refractive index may be controlled by the conditions for forming the film (for example, the flow rate of $CF_4$).

It is needless to say that the refractive index does not have to be adjusted on a per-pixel basis, and a different refractive index may be realized for each filter bank or a region, for example. For example, referring to FIG. 2, the refractive index is set to 1.44 for column I, 1.42 for column II, 1.40 for column III, 1.38 for column IV, and so forth.

As described above, the filters 502A, 502B and 502C are formed by a conductive thin film filter (plasmon resonator) 502, and are structures obtained by patterning a periodic structure on a metal thin film filter (FIGS. 3(A) to 3(D), FIGS. 4(A) and 4(B)) formed of Al or Ag, for example, at a sub-wavelength pitch.

Moreover, also in the example in FIG. 9, a general color filter 508 of organic pigment or dye may be arranged.

Figure 10:
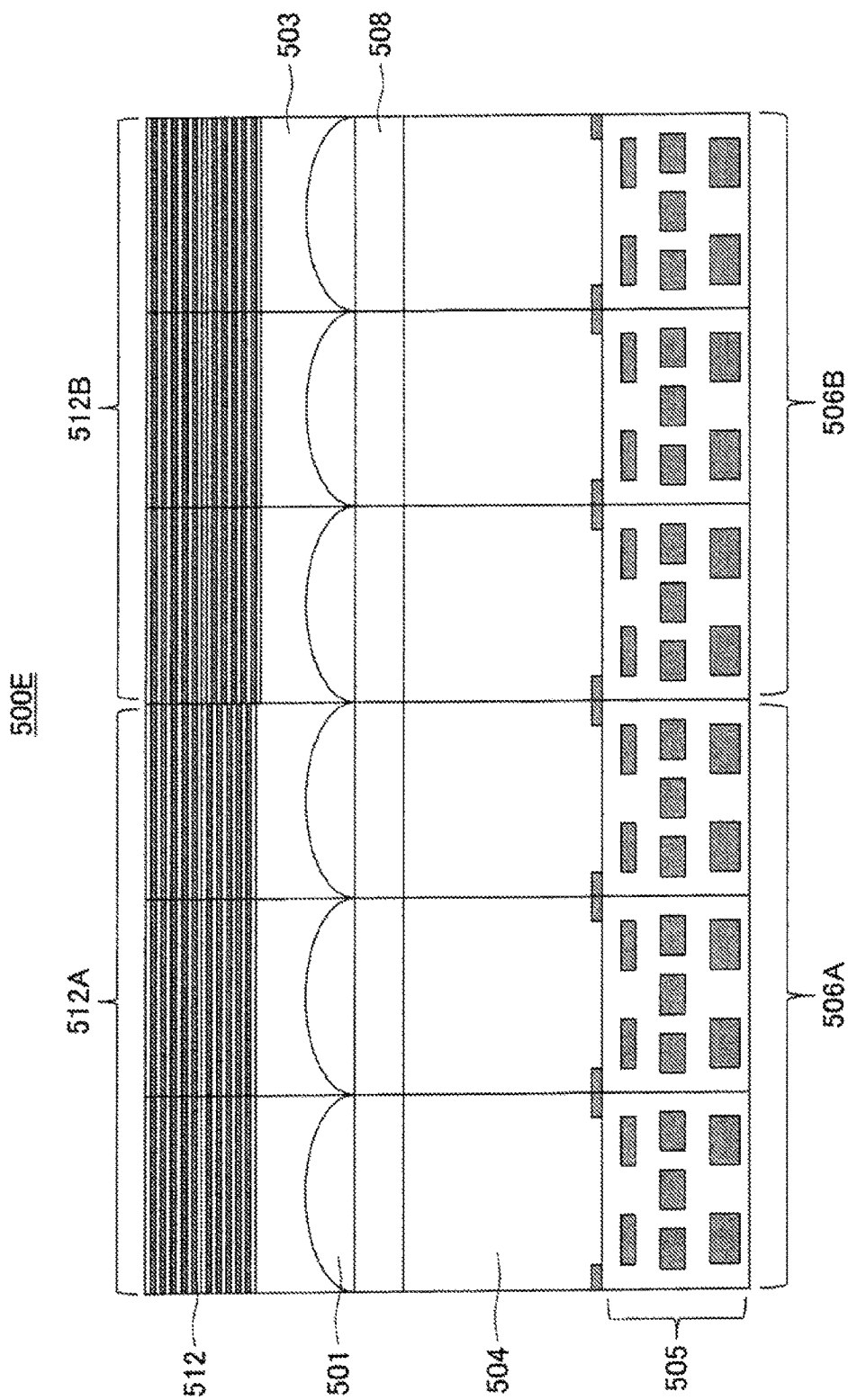
FIG. 10 is a diagram showing a sixth example structure of the backside illumination (BSI) CMOS solid-state image sensor where the present metal thin film filter is arranged.

FIG. 10 is a diagram showing a sixth example structure of the backside illumination (BSI) CMOS solid-state image sensor where the present metal thin film filter is arranged.

In order to facilitate understanding, the structural parts in FIG. 10 the same as those in FIGS. 5 to 9 are denoted with the same reference signs.

Unlike the CMOS solid-state image sensors 500 to 500D in FIGS. 5 to 9 where metal thin film filters are arranged, a CMOS solid-state image sensor 500E in FIG. 10 has a structure where a photonic filter is arranged.

Photonic filters 512A and 512B are optical filters where media of high refractive index and media of low refractive index are stacked at a ¼ wavelength pitch of electromagnetic waveform desired to be passed.

With the photonic filters 512A and 512B, narrow band filters that pass only specific electromagnetic wavelengths may be realized by adjusting the film thickness of low refractive index layers between the filters.

FIG. 10 shows an example structure where the photonic filter 512 is mounted instead of the metal thin film filter.

The photonic filter 512 may use a silicon dioxide film ($SIO_2$) or magnesium fluoride ($MgF_2$) as the low refractive index layer.

On the other hand, as the medium of high refractive index, an oxide or a nitride such as silicon nitride ($Si_3N_4$), titanium dioxide ($TiO_2$), tantalum pentoxide ($Ta_2O_5$), zirconium dioxide ($ZrO_2$), niobium pentoxide ($Nb_2O_5$), or hafnium oxide ($HfO_2$) is desirable.

Here, the photonic filter 512A is mounted on three adjacent pixels 506A, and the photonic filter 512B is mounted on other three pixels 506B, but it is needless to say that the filters may be shared by not only three pixels, but by arbitrary number of adjacent pixels.

Moreover, also in the example in FIG. 10, a general color filter 508 of organic pigment or dye may be arranged.

<5. Method of Estimating Electromagnetic Spectrum Waveform of Subject>

Next, a method of estimating an electromagnetic spectrum waveform of a subject by a spectroscopic imaging system including a spectroscopic solid-state image sensor of the present embodiment will be schematically described.

Figure 11:
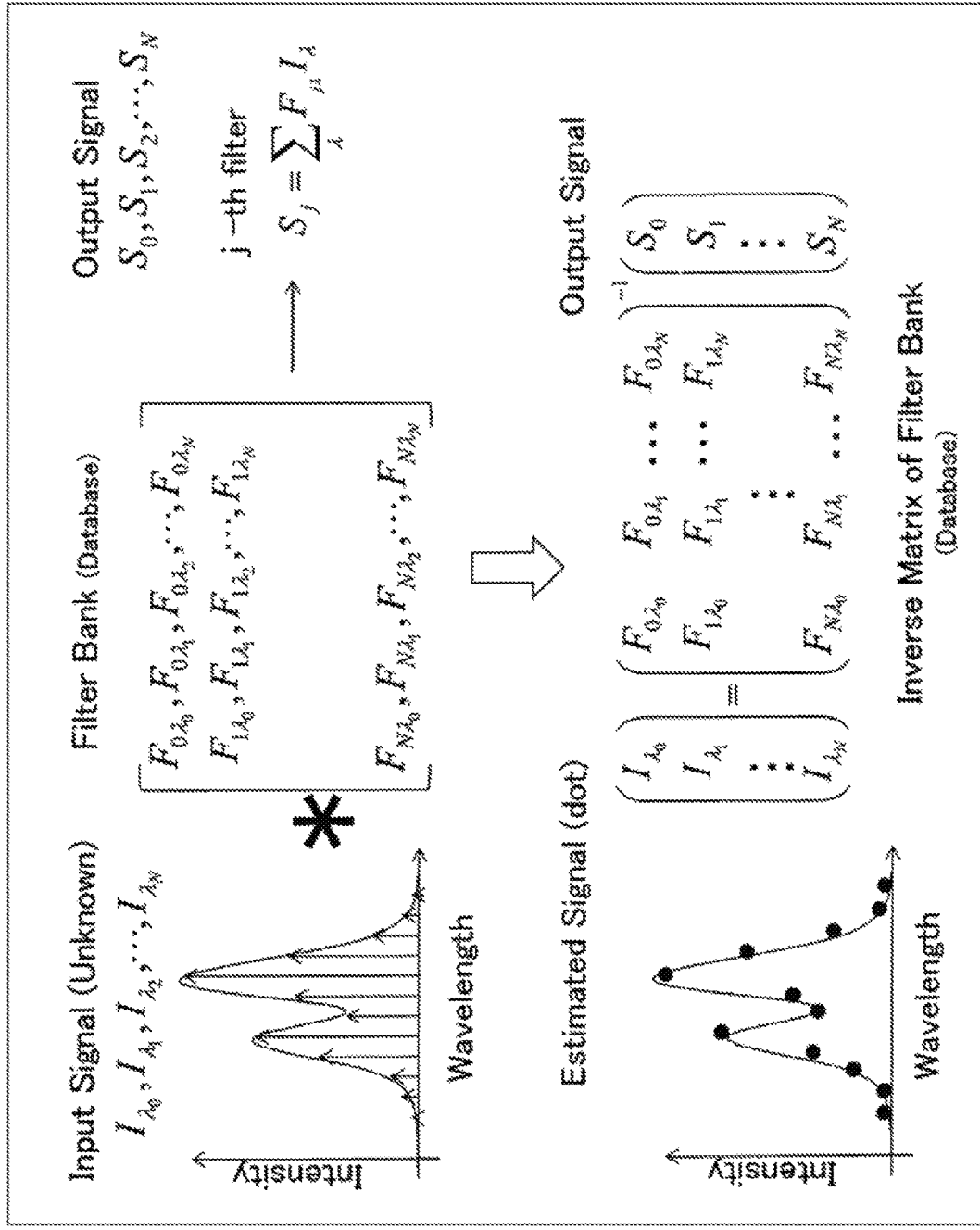
FIG. 11 is diagram for schematically describing a method of estimating an electromagnetic spectrum waveform of a subject by a spectroscopic imaging system including a spectroscopic solid-state image sensor according to the present embodiment.

FIG. 11 is diagram for schematically describing a method of estimating an electromagnetic spectrum waveform of a subject by a spectroscopic imaging system including a spectroscopic solid-state image sensor according to the present embodiment.

The spectrum (I_λ0, I_λ1, . . . I_λN) of a subject is unknown.

Here, for the sake of simplicity, intensity distribution in the wavelength direction with no spatial resolution will be considered instead of a two-dimensional image. A case is considered where the spectrum profile of the subject is desired to be obtained as an intensity information profile of wavelengths at N points. The wavelength spectrum desired to be obtained is described using wavelengths at N points as follows.

[Math 1]

$$\lambda\_0, \lambda\_1, \ldots \lambda\_N \quad (1)$$

Wavelengths are, respectively, $\lambda\_0, \lambda\_1, \ldots \lambda\_N$.

Now, the solid-state image sensor of the present embodiment holds N types of filters as the filter bank, and the transmittance of each filter has transmission properties as follows.

[Math 2]

$$F\_0\_\lambda 0, F\_0\_\lambda 1, \ldots, F\_0\_\lambda N \quad (2\text{-}1)$$

$$F\_1\_\lambda 0, F\_1\_\lambda 1, \ldots, F\_1\_\lambda N \quad (2\text{-}2)$$

$$\vdots$$

$$F\_N\_\lambda 0, F\_N\_\lambda 1, \ldots, F\_N\_\lambda N \quad (2\text{-}3)$$

The transmission properties are determined by the structure of the metal thin film filter and the refractive index of the medium that is filled around the metal thin film filter, and thus, designing/measurement thereof in advance, and storage of the same as a database in a memory inside the imaging device are possible.

Then, when the amount of signal detected by each pixel of the solid-state image sensor is given as Formula (3), the estimated electromagnetic wave spectrum of the subject may be directly obtained from (2) and (3) by calculation of inverse matrix as shown in FIG. 11.

[Math 3]

$$S\_0, S\_1, \ldots S\_N \quad (3)$$

Then, due to the above, if the SN ratio (Signal to Noise Ratio) of the signal is sufficiently high, and the transmittance of the filters is accurately measured, the electromagnetic wave intensity at N types of electromagnetic wavelengths are obtained, and the wavelength spectrum may thereby be obtained by calculation.

Furthermore, in the present embodiment, the transmission property data of the filter bank may be held in a recording section of the system as a rewritable database.

Here, the wavelength resolution of the input spectrum may be expressed as $\Delta\lambda/\lambda=N$. The $\Delta\lambda$ indicates the wavelength resolution, and the $\lambda$ indicates the bandwidth to be captured by the image sensor. The number of types of filters is assumed to be N.

The present imaging system holds matrix factors or inverse matrix factors of the filter properties as a database. According to the present imaging system, the intensity information of the input spectrum at each wavelength may be calculated by product-sum operation with a pixel value corresponding to each filter, and the input spectrum may be reproduced by arranging the results in the wavelength direction.

Figure 12:
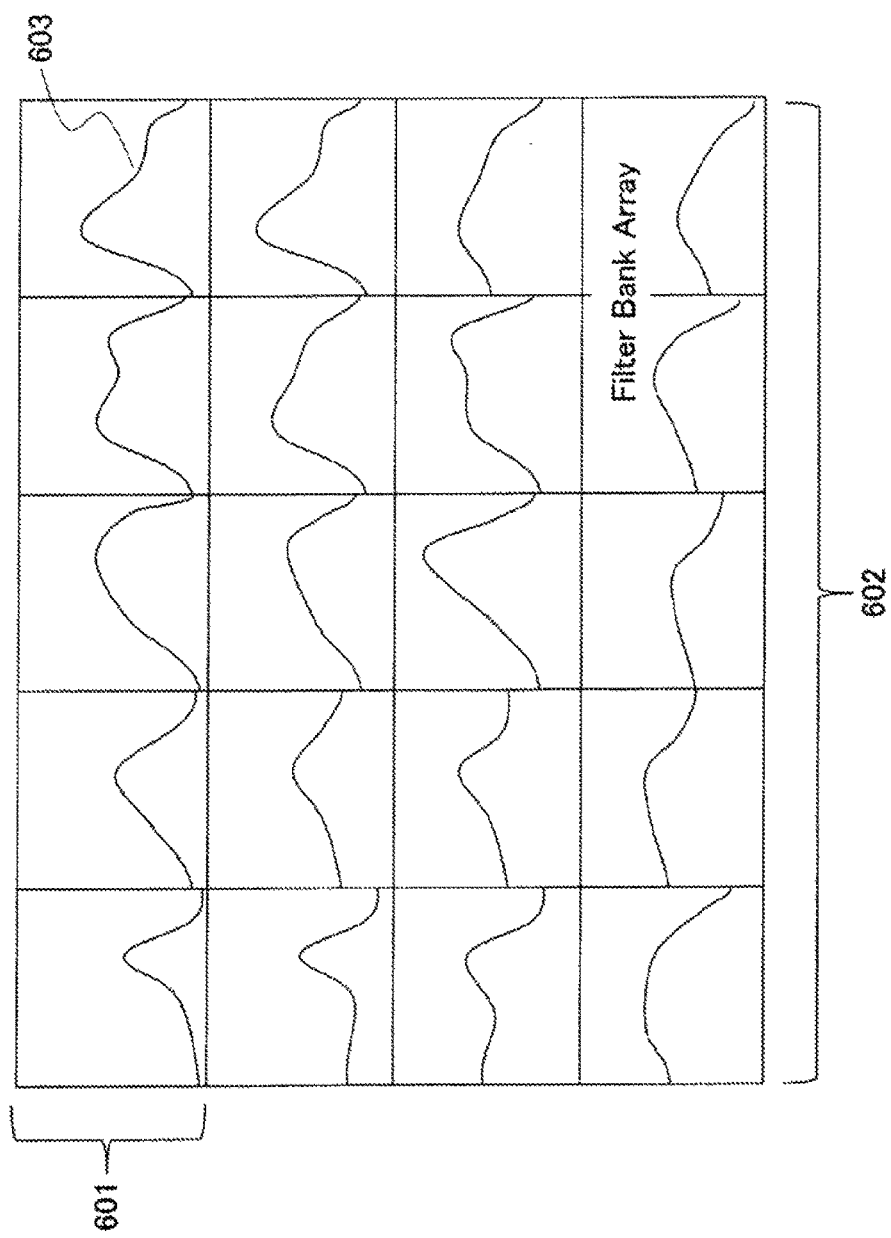
FIG. 12 is a schematic diagram of a two-dimensional spectrum map that is obtained by a spectroscopic device configured from total 20 units of filter banks, vertically 4 units and horizontally 5 units.

FIG. 12 is a schematic diagram of a two-dimensional spectrum map that is obtained by a spectroscopic device configured from total 20 units of filter banks, vertically 4 units and horizontally 5 units.

In FIG. 12, the reference sign 601 indicates a unit, the reference sign 602 indicates a filter bank array, and the reference sign 603 indicates a captured image.

Each unit 601 is configured from a filter bank with K*L types of filters (here, K and L are integers of one or more), and as shown in FIG. 11, each includes a function of reproducing an optical spectrum not having spatial resolution.

Furthermore, the filter banks are arranged in an array to form a filter bank array. That is, in FIG. 12, a spectroscopic two-dimensional captured image 603 of 4×5=20 pixels is obtained.

Next, a method of increasing the spatial resolution by capturing a color spectrum at each position while shifting the solid-state image sensor by a pitch half the unit of the filter bank will be schematically described.

Figure 13:
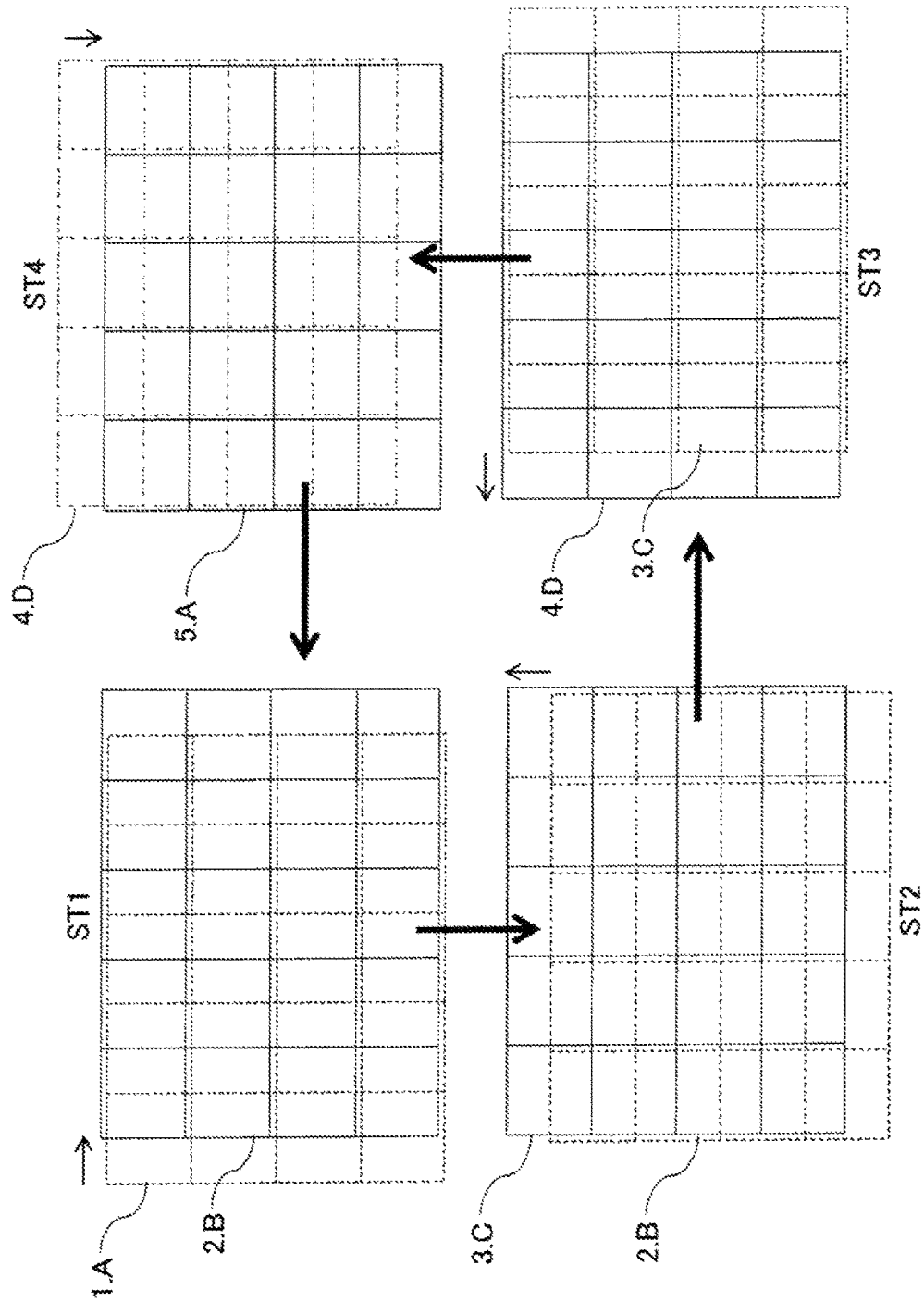
FIG. 13 is a diagram for schematically describing a method of increasing the spatial resolution by capturing a color spectrum at each position while shifting the solid-state image sensor according to the present embodiment by a pitch half the unit of the filter bank.

FIG. 13 is a diagram for schematically describing the method of increasing the spatial resolution by capturing a color spectrum at each position while shifting the solid-state image sensor according to the present embodiment by a pitch half the unit of the filter bank.

First, in the first step ST1, the sensor is at a position A (1.A). When capturing at the position A is completed, shifting to a position B takes place in the next step (2.B).

Then, in the next step ST2, shifting to a position C (3.C) takes place.

In the next step ST3, shifting to a position D takes place (4.D).

Then, by shifting from the position D to the position A in step ST4, the first position is reached (5.A). Capturing is performed at each of these positions (A, B, C, D) and the pieces of wavelength data are synthesized to thereby enable two-dimensional spectroscopic imaging at higher resolution.

In this manner, the solid-state image sensor of the present embodiment includes a function of shifting the image sensor by a minute distance on a plane horizontal to the plane where two-dimensional pixels are located. The timing of shifting the image sensor is in accordance with a reference time that is synchronous with a sensor read timing such as a read frame time or the like for pixel output.

Also, as described above, the solid-state image sensor includes a function of shifting the image sensor by a minute distance on a plane horizontal to the plane where two-dimensional pixels are located, and the amount of shifting is half the size, or an integral submultiple, of one unit of filter bank in the X-axis/Y-axis direction.

The two-dimensional image sensor may acquire the spectrum data of each pixel ever time the sensor is shifted by a minute distance. Furthermore, by synthesizing a spectrum data set of coarse spatial resolution acquired for each type of combination pattern of the amount of shifting, a two-dimensional map of finer spatial resolution may be synthesized.

Next, a method of configuring a database of filter transmittance held by the spectroscopic imaging system of the present embodiment will be described.

Figure 14:
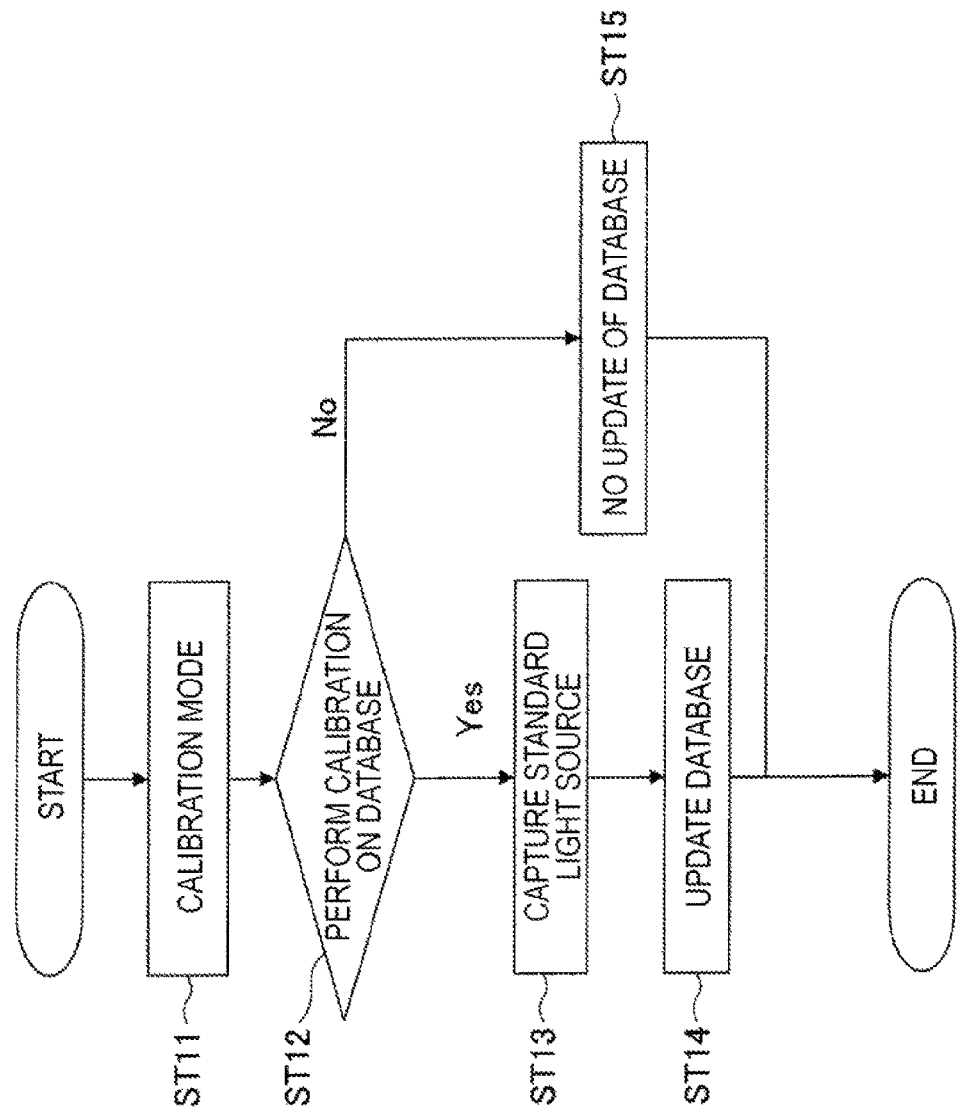
FIG. 14 is a flowchart showing a method of calibrating a database of filter transmittance held by the spectroscopic imaging system according to the present embodiment.

FIG. 14 is a flowchart showing a method of calibrating a database of filter transmittance held by the spectroscopic imaging system according to the present embodiment.

According to this method, when a calibration mode is started (ST11), whether calibration of the database is to be performed or not is determined (ST12).

In the case of performing calibration, by capturing a standard light source (ST13), the database may be overwritten/updated (ST14). Accordingly, even if there is long-time degradation of the filter properties, the sensor properties or the system, high reproducibility may be maintained.

Additionally, the database is not updated in the case calibration of the database is not performed (ST15).

<6. Example Configuration of Spectroscopic Imaging System>

Figure 15:
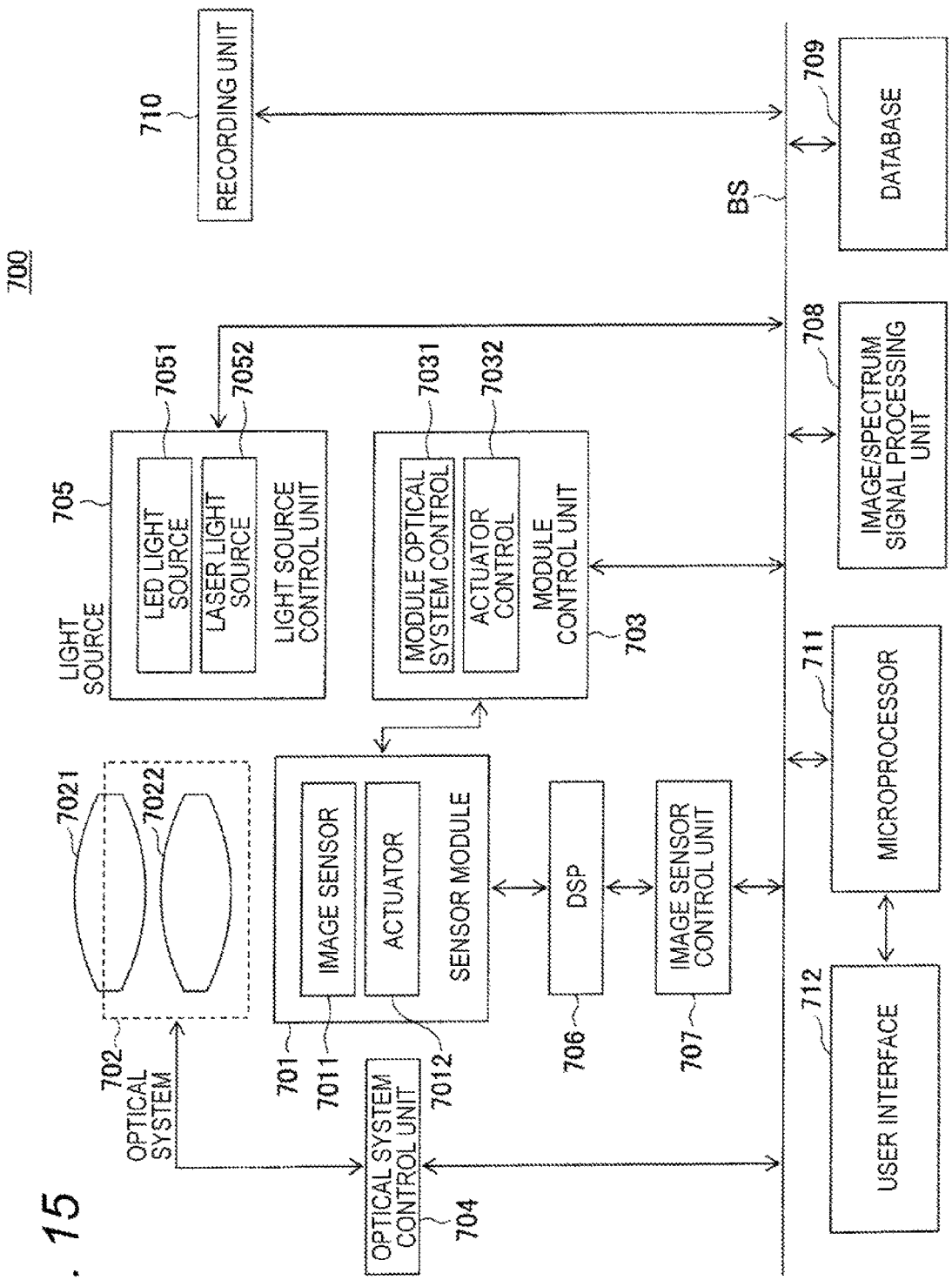
FIG. 15 is a block diagram showing an example configuration of the spectroscopic imaging system according to the present embodiment.

FIG. 15 is a block diagram showing an example configuration of the spectroscopic imaging system according to the present embodiment.

A spectroscopic imaging system 700 in FIG. 15 includes a sensor module 701, an optical system 702, a module control unit 703, an optical system control unit 704, a light source control unit 705, a DSP (signal processing unit) 706, and an image sensor control unit 707.

Furthermore, the spectroscopic imaging system 700 includes an image/spectrum signal processing unit 708, a database 709, a recording unit 710, a microprocessor 711, and a user interface 712.

In the spectroscopic imaging system 700, the module control unit 703, the optical system control unit 704, the light source control unit 705, the image sensor control unit 707, the image/spectrum signal processing unit 708, the database 709, the recording unit 710, and the microprocessor 711 are connected by a bus BS.

The microprocessor 711 performs overall control upon reception of a capturing process or the like by a user input via the user interface 712.

The sensor module 701 is provided with a solid-state image sensor 7011 according to the present embodiment described above (the solid-state image sensor 100 in FIG. 1 or the like), and an actuator 7012.

The actuator 7012, which is a mechanism for shifting the solid-state image sensor 7011, is formed as an electrostatic actuator, a polymer actuator, a shape-memory alloy or the like.

The module control unit 703 includes a control unit 7031 for controlling a module optical system of the sensor module 701, and a control unit 7032 for controlling the actuator 7012, and performs control of a drive system of the sensor module 701.

The optical system 702 is configured by including an objective lens 7021, an imaging lens 7022 for imaging a subject image on a light receiving surface of the solid-state image sensor 7011, and the like, and is controlled by the optical system control unit 704.

The light source control unit 705 controls an LED light source 7051 and a laser light source 7052.

As described above, the present system includes a light source output of high brightness and of a visible wavelength or a specific wavelength of near infrared light, such as a laser, an LED light source or the like.

Captured data obtained by the sensor module 701 is subjected to a predetermined process by the DSP 706 and the image sensor control unit 707, and is then transferred to the image/spectrum signal processing unit 708 and the like.

At the image/spectrum signal processing unit 708, signal processing such as estimation of a spectrum wave as described above is performed. At this time, the database 709 is accessed as appropriate as described above, and an update process or the like is performed as necessary.

The image/spectrum signal processing unit 708 includes a signal restoration function of estimating an input spectrum by product-sum operation of transmittance information of each filter in the database 709 held by a storage unit and each pixel output, for example.

<7. Manufacturing Method of Metal Thin Film Filter>

In the following, a manufacturing method of a metal thin film filter of the present spectroscopic imaging device will be schematically described.

However, the manufacturing method described below is not restrictive so long as the structure of the present metal thin film filter may be realized with high accuracy. Also, here, the method of mounting the present structure by using aluminum, which is widely used in the manufacturing process of a general CMOS solid-state image sensor, is described, but other conductors such as Ag or Au may also be used as a matter of course.

The present structure is basically a structure where a smoothing layer such as a silicon dioxide film is formed on an upper surface of a photodetector of the solid-state image sensor, and a conductive thin film is arranged on the smoothing layer.

It is needless to say that the photodetector unit of the present structure below may be a general CMOS solid-state image sensor, and moreover, it is not restricted to the CMOS solid-state image sensor, and a CCD solid-state image sensor may also be used. Accordingly, a known method may be applied with respect to the structure and the manufacturing method of a photoelectric conversion device, and description thereof is omitted herein.

First, the smoothing layer which is to be the base for mounting the metal thin film filter is realized by stacking silicon dioxide films by the plasma CVD method or the like.

Then, on its top, a metal thin film which is to be the base of the metal thin film filter is stacked by sputtering or the like. The fine structure for realizing the filter function of the metal thin film is fabricated by a technique such as electron beam lithography, photolithography, an interference exposure method, or etching.

As the etching, anisotropic dry etching is desirable, and gas used for the etching is preferably etching gas of tetrafluoromethane ($CF_4$) series.

As the alternatives, sulfur hexafluoride, trifluoromethane, xenon difluoride and the like are also suitable. Alternatively, a nano-stamper of a basic structure may be fabricated by electron beam lithography, and the structure may be transferred by a nano-imprint technique.

Next, an inter insulation film for filling the gap of the metal thin film filter is stacked by the plasma CVD method or the like. The plasma CVD method is used here because this enables film forming at a relatively low temperature (250° C. to 400° C.) compared to a low pressure CVD method, and is advantageous in forming a protective film after mounting of a metal thin film filter of metal such as Al.

It is needless to say that the method described above is not restrictive, and other methods are also allowed as long as they may be applied after a metal thin film has been formed.

Additionally, the medium of an insulation layer used for a visible wavelength band is desirably of a composite material mainly composed of oxide silicon ($SiO_2$) and $SiO_2$. Alternatively, magnesium fluoride ($MgF_2$) and the like may also be used.

Alternatively, although the refractive index will be higher, an oxide or a nitride such as silicon nitride ($Si_3N_4$), titanium dioxide ($TiO_2$), tantalum pentoxide ($Ta_2O_5$), zirconium dioxide ($ZrO_2$), niobium pentoxide ($Nb_2O_5$), or hafnium oxide ($HfO_2$) may also be used.

Figure 16:
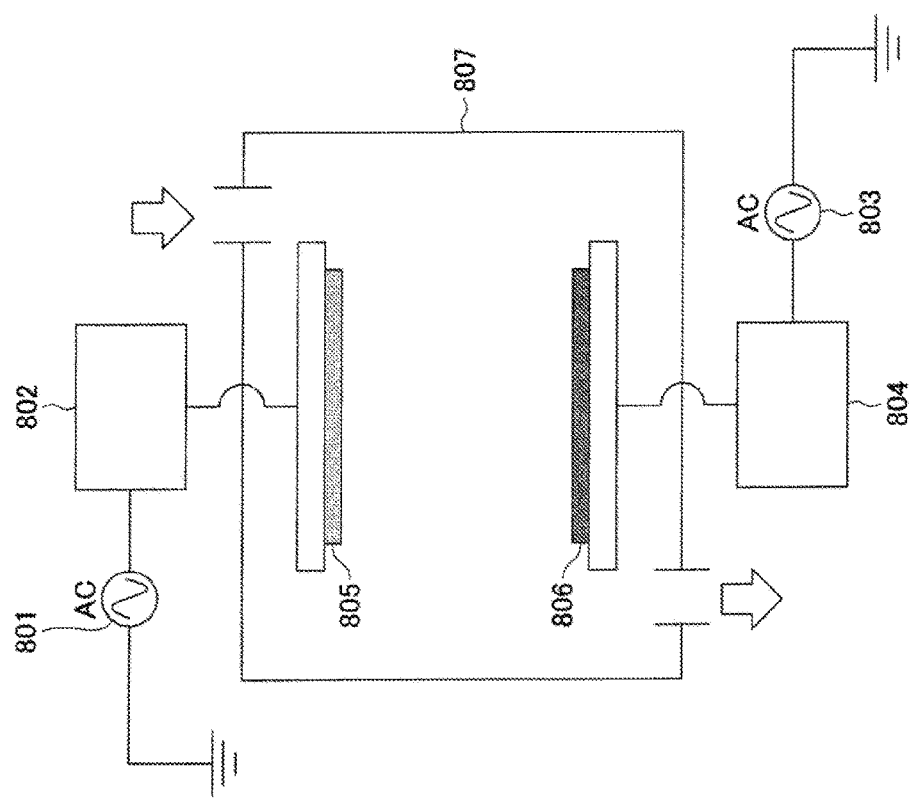
FIG. 16 is a diagram showing a schematic configuration of a manufacturing device of the metal thin film filter.

FIG. 16 is a diagram showing a schematic configuration of a manufacturing device of the metal thin film filter.

A manufacturing device 800 in FIG. 16 is configured including high-frequency power sources 801 and 803, impedance matching units 802 and 804, a substrate 805, a target 806, a vacuum Dewar 807, and the like.

The substrate 805 is connected to the high-frequency power source 801 via the impedance matching unit 802.

In the same manner, the target 806 is connected to the high-frequency power source 803 via the impedance matching unit 804.

Here, the frequency of the high-frequency power source is generally 13.56 MHz.

The vacuum Dewar 807 is filled with a mixed gas mainly of an inert gas (for example, Ar gas), and typically, gas pressure of approximately 0.1 to 10 mTorr is desirable.

Plasma is generated by supplying power to the target 806 and the substrate 805 by the high-frequency power sources 803 and 801. When AC voltage is applied to the target 806, DC bias (self-bias effect) due to non-linearity of probe characteristics is applied, and the time average potential will be negative for the target 806.

Thus, positively charged gaseous ions gain kinetic energy by the potential difference and collide with the target 806. Due to this action, the atoms/molecules on the surface of the target object scatter, and the material particles attach to the substrate 805, and a thin film is stacked on the substrate 805.

For its part, the substrate 805 also has the high-frequency power source 801 and the impedance matching unit 802 connected thereto. Accordingly, by adjusting the power to be supplied to the substrate 805, the type of gas, and the pressure, the type of ions that collide, the level of the kinetic energy, and the effect of the sputtering may be controlled.

In the case of performing only the sputtering etching that does not involve film forming by the sputtering, the high-frequency power may be supplied only to the substrate 805.

Also, at the time of film forming, by performing film forming while adjusting the gas flow rate of $CF_4$ or the like, the refractive index of $SiO_2$ may be controlled within a narrow range.

Thus, a pixel region may be divided into a plurality of regions, and dielectric films with different refractive indices for each region may be mounted. Accordingly, even if the processed pattern is the same for the metal thin film filters, the plasmon resonance wavelengths are slightly different, and as a result, mounting of a greater number of types of filters is enabled, thereby enabling acquisition of spectrum data with higher wavelength resolution (high dispersion).

As described above, according to the present embodiment, the following effects may be achieved.

An optical spectrum is yielded with high sensitivity by a single chip. Even if the single filter size of the metal thin film filter and the size of a single pixel of the solid-state image sensor are different, the following advantage may be achieved by sharing the filter by adjacent pixels of imaging pixels.

That is, a spectroscopic/imaging function may be realized without a dedicated solid-state image sensor simply by mounting a filter, and a spectroscopic/imaging device having a higher performance may be realized at a lower cost.

Even with metal thin film filters with the same pattern, by increasing the refractive index types to X types, the types of filters may be, in effect, increased by X times, and as a result, dispersion/imaging with higher wavelength resolution is enabled.

Two-dimensional spectrum mapping with high spatial resolution is enabled. A metal thin film filter is shared by adjacent pixels over a relatively wide range of 8×8 pixels or 16×16 pixels, and thus, with existing methods, there is an issue that the spatial resolution is greatly decreased at the time of performing two-dimensional spectrum mapping. By combining the pixel shift method according to the present technology, more expensive two-dimensional spectroscopic imaging may be realized at a lower cost.

By holding a database of transmission properties of N types of filters, and including a function of updating the same, the input spectrum may be restored with high accuracy byproduct-sum operation of the data and the output pixel value.

Unlike a narrow band filter such as a grating, each filter is not narrow band, and thus a method of effectively using light and estimating the input spectrum by calculation is achieved, and both high wavelength resolution and high sensitivity may be achieved.

Additionally, the present technology may also be configured in the following manner.

(1) A solid-state image sensor including:

a two-dimensional pixel array where pixels each including a photoelectric conversion device are arranged in an array; and a plurality of types of filters that are arranged facing a pixel region of the two-dimensional pixel array, the filters each including a spectrum function and a periodic fine pattern shorter than a wavelength to be detected, wherein each of the filters forms a unit which is larger than the photoelectric conversion device of each pixel on the two-dimensional pixel array, where one type of filter is arranged for a plurality of adjacent photoelectric conversion device groups, the plurality of types of filters are arranged for adjacent unit groups to form a filter bank, and the filter banks are arranged in a unit of N×M, where N and M are integers of one or more, facing the pixel region of the two-dimensional pixel array.

(2) The solid-state image sensor according to (1) above, wherein the filters include a metal thin film having a periodic fine processing pattern shorter than a wavelength to be detected, and the metal thin film filter is formed of a metal whose plasma frequency is in a ultraviolet range/visible wavelength range, and is a one-dimensional grating or a two-dimensional grating to which concave/convex portions or hole structures are periodically arranged with a submicron-scale pitch.

(3) The solid-state image sensor according to (2) above, wherein the metal thin film filter includes a filtering function of selectively absorbing/passing a specific electromagnetic wave in an electromagnetic wavelength band desired to be detected, and a gap of a periodic pattern of the concave/convex portions or the hole structures of the filter has a hollow structure or is filled with a dielectric material.

(4) The solid-state image sensor according to (2) above, wherein the metal thin film filter includes a filtering function of selectively absorbing/passing a specific electromagnetic wave in an electromagnetic wavelength band desired to be detected, a gap of a periodic pattern of the concave/convex portions or the hole structures of the filter is filled with a dielectric material, and a gap portion of at least one filter bank among a plurality of filter banks is filled with a dielectric material of a refractive index different from other filter banks.

(5) The solid-state image sensor according to any one of (2) to (4) above, wherein the metal thin film filter is arranged on a smoothing layer of a dielectric material.

(6) The solid-state image sensor according to any one of (2) to (4) above, wherein the metal thin film filter is arranged on a smoothing layer formed of a dielectric material, and a refractive index of the smoothing layer of a dielectric material is different for each of a plurality of regions of the pixel region.

(7) The solid-state image sensor according to any one of (2) to (6) above, wherein each of the filters of the metal thin film filter arranged facing the pixel region has an area same or greater than each pixel forming the two-dimensional pixel array, and one type of filter is arranged for a pixel group of U pixels that are adjacent horizontally, in an X-axis direction, and V pixels that are adjacent vertically, in a Y-axis direction, the U and the V being integers of one or more.

(8) The solid-state image sensor according to any one of (1) to (7) above, wherein the filters are of K types in an X-axis direction and L types in an Y-axis direction, and each filter group forms one filter bank unit by K*L types of filters, where there are one or more units of filter banks, the K and the L being integers of one or more.

(9) The solid-state image sensor according to (8) above, wherein the filter banks to be arranged are of N types in the X-axis direction and M types in the Y-axis direction, the N and the M being integers of one or more.

(10) The solid-state image sensor according to any one of (1) to (9) above, including:

a storage unit for holding, as a database, transmittance information of each filter of the filter bank for each electromagnetic wavelength.

(11) The solid-state image sensor according to any one of (1) to (9) above, including:

a storage unit for holding, as a database, transmittance information of each filter of the filter bank for each wavelength, wherein re-calibration and update of the database are enabled by capturing a standard light source.

(12) The solid-state image sensor according to (10) or (11) above, including:

a signal processing unit for estimating an input spectrum by product-sum operation of the transmittance information of each filter in the database held by the storage unit and each pixel output.

(13) The solid-state image sensor according to any one of (1) to (12) above, wherein the image sensor formed from the two-dimensional pixel array includes a mechanism for shifting by a minute distance on a plane horizontal to a plane where pixels are two-dimensionally located, and a timing of shifting the image sensor is in accordance with a reference time that is synchronous with a sensor read timing such as a read frame time for pixel output.

(14) The solid-state image sensor according to any one of (1) to (13) above, wherein the image sensor formed from the two-dimensional pixel array includes a mechanism for shifting by a minute distance on a plane horizontal to a plane where pixels are two-dimensionally located, an amount of shifting is half a size, or an integral submultiple, of one unit of filter bank in X-axis/Y-axis direction, and the solid-state image sensor includes a processing unit for synthesizing a two-dimensional map of finer spatial resolution by acquiring spectrum data of each pixel every time a sensor of the image sensor is shifted by the minute distance and synthesizing a spectrum data set of coarse spatial resolution acquired for each type of combination pattern of the amount of shifting.

(15) The solid-state image sensor according to any one of (1) to (14) above, wherein the solid-state image sensor is a CMOS solid-state image sensor, and each of the pixels includes an on-chip light condensing element for each pixel, a smoothing layer is arranged while maintaining a light condensing function by stacking a material with a lower refractive index than the light condensing element on the on-chip light condensing element, and the filter is arranged on the smoothing layer.

(16) The solid-state image sensor according to any one of (1), (8) to (15) above, wherein the filters include an optical filter that passes an electromagnetic wave, where a medium of high refractive index and a medium of low refractive index are stacked.

(17) An imaging system including:

a solid-state image sensor; and an optical system for imaging a subject image on a two-dimensional pixel array of the solid-state image sensor, wherein the solid-state image sensor includes the two-dimensional pixel array where pixels each including a photoelectric conversion device are arranged in an array, and a plurality of types of filters that are arranged facing a pixel region of the two-dimensional pixel array, the filters each including a spectrum function and a periodic fine pattern shorter than a wavelength to be detected, each of the filters forms a unit which is larger than the photoelectric conversion device of each pixel on the two-dimensional pixel array, where one type of filter is arranged for a plurality of adjacent photoelectric conversion device groups, the plurality of types of filters are arranged for adjacent unit groups to form a filter bank, and the filter banks are arranged in a unit of N×M, where N and M are integers of one or more, facing the pixel region of the two-dimensional pixel array.

REFERENCE SIGNS LIST

100 Solid-state image sensor
110 Pixel array
110A Pixel
111 Photo diode (Photoelectric conversion device)
112 Transfer transistor
113 FD
114 Amplification transistor
115 Selection transistor
116 Reset transistor
120 Vertical scanning circuit
130 Horizontal transfer scanning circuit
140 Column ADC circuit
150 PLL circuit
150 DAC (Digital analog converter)
170 Sense amplifier circuit (S/A)
201 Two-dimensional pixel group (Pixel array)
202 Metal thin film filter group (Filter bank, Unit)
203 Filter bank array
300 Metal thin film filter
500, 500A to 500E Solid-state image sensor
501 On-chip microlens
502A, 502B, 502C Metal thin film filter
503 Smoothing layer
504 Photo diode
505 Signal wiring layer
506A, 506B, 506C Adjacent pixel
507, 507A Smoothing layer
512A, 512B Photonic filter
700 Spectroscopic imaging system
701 Sensor module
702 Optical system
703 Module control unit
704 Optical system control unit
705 Light source control unit 706 DSP (Signal processing unit)
707 Image sensor control unit
708 Image/spectrum signal processing unit
709 Database
710 Recording unit
711 Microprocessor
712 User interface

The invention claimed is:

1. A solid-state image sensor comprising:
pixels arranged in a two-dimensional pixel array, where each pixel includes a photoelectric conversion device; and
a filter bank array comprised of a plurality of filter banks overlaying a light incident surface of the two dimensional pixel array, the filter bank array having N×M filter banks where N and M are each integers of 1 or more,
wherein,
each filter bank comprises a plurality of filters which are not all selective to a same electromagnetic wavelength,
each filter bank overlays an array of U×V pixels where U and V are each integers of 2 or more,
each filter of each filter bank array overlays two or more photoelectric conversion devices,
each filter bank is identical to every other filter bank in terms of arrangement of the filters,
for each filter bank, the outputs of the photoelectric conversion devices of that filter bank are combined to provide an electromagnetic spectrum waveform unique to that filter bank with values for a plurality of wavelengths, and
each filter includes a spectrum function establishing only one electromagnetic wavelength band to be detected by all of the photoelectric conversion devices overlain by the filter and a periodic fine pattern shorter than the electromagnetic wavelength to be detected by the photoelectric conversion devices overlain by the filter, the periodic fine pattern absorbing or passing a specific electromagnetic wave in the electromagnetic wavelength band to be detected by the photoelectric conversion devices overlain by the filter.

2. The solid-state image sensor according to claim 1, wherein at least one of the filters is a metal thin film filter that includes a metal whose plasma frequency is in an ultraviolet range/visible wavelength range, and is a one-dimensional grating or a two-dimensional grating with concave/convex portions or hole structures periodically arranged at a submicron-scale pitch.

3. The solid-state image sensor according to claim 2, wherein:
the metal thin film filter selectively adsorbs/passes the specific electromagnetic wave in an electromagnetic wavelength band desired to be detected, and
a gap of a periodic pattern of the concave/convex portions or the hole structures of the filter has a hollow structure or is filled with a dielectric material.

4. The solid-state image sensor according to claim 2, wherein:
the metal thin film filter selectively adsorbs/passes the specific electromagnetic wave in an electromagnetic wavelength band desired to be detected,
a gap of a periodic pattern of the concave/convex portions or the hole structures of the filter is filled with a dielectric material, and
a gap portion of at least one filter bank among a plurality of filter banks is filled with a dielectric material of a refractive index different from other filter banks.

5. The solid-state image sensor according to claim 2, wherein the metal thin film filter is on a smoothing layer comprised of a dielectric material.

6. The solid-state image sensor according to claim 2, wherein the metal thin film filter is on a smoothing layer comprised of a dielectric material, and at least two regions of the smoothing layer have different refractive indices.

7. The solid-state image sensor according to claim 2, wherein a first type of filter is arranged for a pixel group of U pixels that are adjacent horizontally, in an X-axis direction, and a second type of filter is arranged for a pixel group of V pixels that are adjacent vertically, in a Y-axis direction, where U and V each represent an integer of one or more.

8. The solid-state image sensor according to claim 1, comprising: a storage unit for holding, as a database, transmittance information of each filter of the filter bank for each electromagnetic wavelength.

9. The solid-state image sensor according to claim 8, comprising:
a signal processing unit for estimating an input spectrum by product-sum operation of the transmittance information of each filter in the database held by the storage unit and each pixel output.

10. The solid-state image sensor according to claim 1, comprising:
a storage unit for holding, as a database, transmittance information of each filter of the filter bank for each wavelength,
wherein re-calibration and update of the database are enabled by capturing a standard light source.

11. The solid-state image sensor according to claim 1,
wherein the image sensor formed from the two-dimensional pixel array includes a mechanism for shifting by a minute distance on a plane horizontal to a plane where pixels are two-dimensionally located, and
a timing of shifting the image sensor is in accordance with a reference time that is synchronous with a sensor read timing such as a read frame time for pixel output.

12. The solid-state image sensor according to claim 1,
wherein the image sensor formed from the two-dimensional pixel array includes a mechanism for shifting by a minute distance on a plane horizontal to a plane where pixels are two-dimensionally located,
an amount of shifting is half a size, or an integral submultiple, of one unit of filter bank in X-axis/Y-axis direction, and
the solid-state image sensor comprises a processing unit for synthesizing a two-dimensional map of finer spatial resolution by acquiring spectrum data of each pixel every time a sensor of the image sensor is shifted by the minute distance and synthesizing a spectrum data set of coarse spatial resolution acquired for each type of combination pattern of the amount of shifting.

13. The solid-state image sensor according to claim 1, wherein:
the solid-state image sensor is a CMOS solid-state image sensor,
each of the pixels includes an on-chip light condensing element,
a smoothing layer is on the on-chip light condensing element, and
the filters are on the smoothing layer.

14. The solid-state image sensor according to claim 1, wherein the filters include an optical filter that passes an electromagnetic wave.

15. The solid-state image sensor according to claim 1, wherein adjacent filters are different from each other by absorbing or passing different specific electromagnetic waves.

16. The solid-state image sensor according to claim 1, further comprising on-chip microlenses between the filters and the pixels.

17. The solid-state image sensor according to claim 1, wherein each filter comprises an array of openings extending through a thin metal layer and an array of partial openings that extend only partially into, but not through the thin metal layer.

18. An imaging system comprising:
   a solid-state image sensor according to claim 1; and
   an optical system configured to provide a subject image on the pixel array of the solid-state image sensor.

19. A spectroscopic device comprising the solid-state image sensor of claim 1.

* * * * *